US008748965B2

(12) United States Patent
Nagashima et al.

(10) Patent No.: US 8,748,965 B2
(45) Date of Patent: Jun. 10, 2014

(54) NONVOLATILE SEMICONDUCTOR MEMORY DEVICE

(75) Inventors: Satoshi Nagashima, Mie (JP); Junya Fujita, Mie (JP); Hideyuki Yamawaki, Mie (JP); Masahiro Kiyotoshi, Mie (JP); Hisataka Meguro, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 281 days.

(21) Appl. No.: 13/197,263

(22) Filed: Aug. 3, 2011

(65) Prior Publication Data

US 2012/0032247 A1 Feb. 9, 2012

(30) Foreign Application Priority Data

Aug. 6, 2010 (JP) ................................. 2010-177990

(51) Int. Cl.
*H01L 29/788* (2006.01)

(52) U.S. Cl.
USPC ......................... 257/315; 257/321; 257/E29.3

(58) Field of Classification Search
CPC ......................... H01L 29/42324; H01L 29/518
USPC .......................................... 257/314, 315, 321
See application file for complete search history.

(56) References Cited

U.S. PATENT DOCUMENTS

| 4,755,865 A * | 7/1988 | Wilson et al. | 257/754 |
| 4,992,391 A * | 2/1991 | Wang | 438/257 |
| 6,657,251 B1 * | 12/2003 | Meguro | 257/316 |
| 7,786,004 B2 * | 8/2010 | Fukuhara | 438/630 |
| 2008/0185630 A1 | 8/2008 | Aoyama et al. | |
| 2011/0291175 A1 * | 12/2011 | Jee et al. | 257/316 |

FOREIGN PATENT DOCUMENTS

| JP | 2001-203346 | 7/2001 |
| JP | 2005-93907 A | 4/2005 |
| JP | 2007-207947 A | 8/2007 |
| JP | 2007-294496 | 11/2007 |
| JP | 2008-98504 | 4/2008 |
| JP | 2009-135298 | 6/2009 |

OTHER PUBLICATIONS

U.S. Appl. No. 12/956,591, filed Nov. 30, 2010, Junya Fujita, et al.
Japanese Office Action issued Dec. 3, 2013 in Patent Application No. 2010-177990 with English Translation.

* cited by examiner

*Primary Examiner* — Jerome Jackson, Jr.
*Assistant Examiner* — Paul Budd
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell transistor obtained by sequentially stacking the gate insulation film, the floating gate electrode, the interelectrode insulation film, and the control gate electrode over the channel semiconductor layer. The control gate electrode has a structure obtained by sequentially stacking the semiconductor film, the silicide phase-change suppressing layer, and the silicide film. In addition, the silicide phase-change suppressing layer includes a polycrystalline silicon film in which at least one of C, F, and N is doped in a concentration range of $1\times10^{20}$ to $5\times10^{21}$ [atom/cm$^3$].

12 Claims, 39 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2010-177990, filed on Aug. 6, 2010; the entire contents of which are incorporated herein by reference.

FIELD

Embodiments described herein relate generally to a nonvolatile semiconductor memory device and a method of manufacturing the same.

BACKGROUND

A technology has been known in which a top portion of a polycrystalline silicon layer included in a control gate electrode of a nonvolatile semiconductor memory device is partially silicided to reduce an electrical resistance of the control gate electrode.

In a case where the top portion of the control gate electrode is partially silicided, the thickness of the silicide layer may problematically become uneven because the reaction rate varies depending on the location of the control gate electrodes.

DETAILED DESCRIPTION

According to an embodiment, a nonvolatile semiconductor memory device includes a memory cell transistor obtained by sequentially stacking a gate insulation film, a floating gate electrode, an interelectrode insulation film, and a control gate electrode that are formed over a channel semiconductor layer. Here, the control gate electrode has a structure in which a first semiconductor film, a silicide phase-change suppressing layer, and a silicide film are stacked in this order on the interelectrode insulation film. In addition, the silicide phase-change suppressing layer includes a polycrystalline silicon film in which at least one element out of C, F, and N is doped in a concentration in the range of $1 \times 10^{20}$ to $5 \times 10^{21}$ [atom/$cm^3$].

Hereinafter, a method of manufacturing a nonvolatile semiconductor memory device according to an embodiment will be described in detail with reference to the accompanying drawings. However, the embodiments are not intended to limit the invention. In addition, cross-sectional views illustrating nonvolatile semiconductor memory devices used in the following embodiments are schematic views, and in the views, a relationship between a thickness and a width of each layer, a thickness ratio between the layers, and the like may be different from those as in a substantial device. Furthermore, the film thicknesses described below are just exemplary, and the invention is not limited thereby.

First Embodiment

Figure 1:
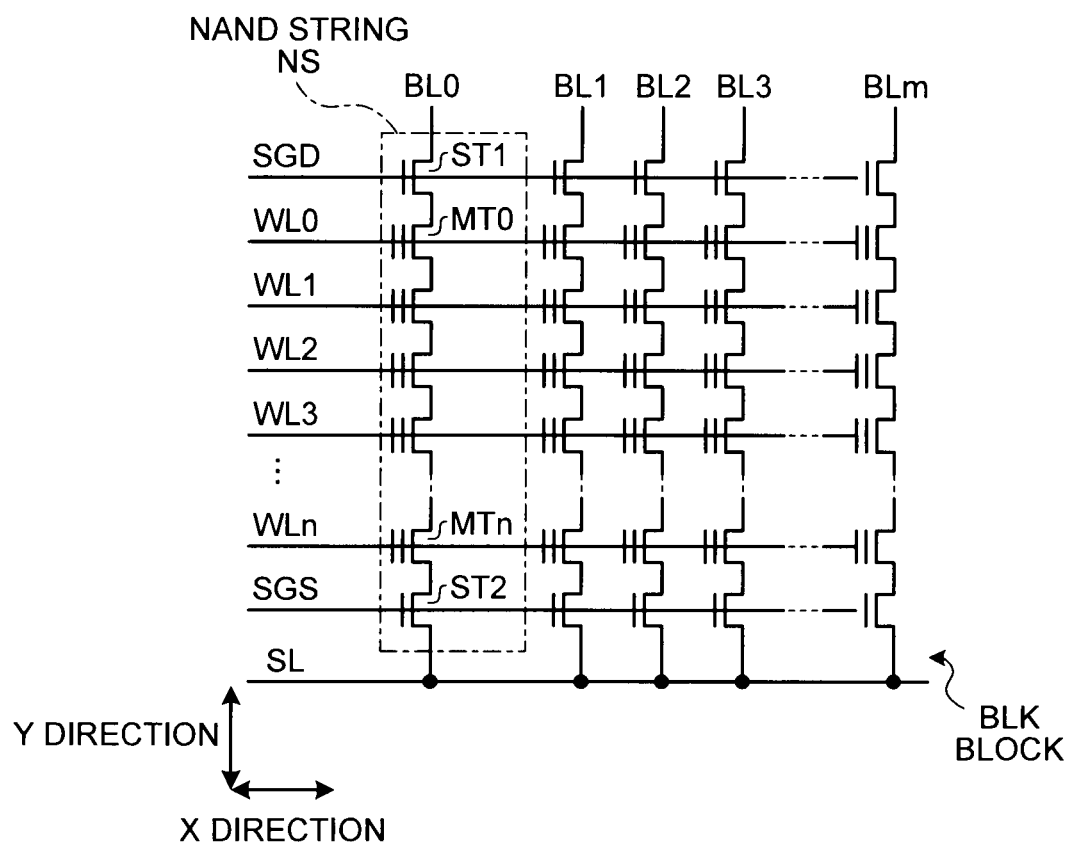
FIG. 1 is a circuit diagram illustrating an exemplary configuration of a memory cell unit of a NAND type flash memory.

In the following embodiments, description will be made with a case in which the nonvolatile semiconductor memory device is applied to a NAND type flash memory. The NAND type flash memory includes a memory cell unit having memory cell transistors (hereinafter, referred to as memory cells) arranged in an array format and a peripheral circuit unit arranged on the periphery of the memory cell unit to control the memory cells of the memory cell unit. Herein, field effect transistors except for the memory cell transistors will be referred to as a peripheral circuit. FIG. 1 is a circuit diagram illustrating an exemplary configuration of the memory cell unit of the NAND type flash memory. FIG. 1 is a circuit diagram illustrating a block that is a unit for erasing data in the NAND type flash memory. In addition, in FIG. 1, the horizontal direction on the paper is denoted by X direction, and the vertical direction on the paper is denoted by Y direction.

The block BLK of the NAND type flash memory includes (m+1) NAND strings NS arranged sequentially along the X direction (where, m denotes an integer equal to or larger than 0). Each NAND string NS includes (n+1) memory cells MT0 to MTn connected in series along the Y direction (where, n denotes an integer equal to or larger than 0) and selection transistors ST1 and ST2 arranged at both ends of the columns of the (n+1) memory cells MT0 to MTn.

Each memory cell MT0 to MTn includes a field effect transistor having a stack gate structure formed on the semiconductor layer serving as a channel. Here, the stack gate structure includes a floating gate electrode, formed on the semiconductor layer with the gate insulation film interposed between the semiconductor layer and the floating gate electrode, and a control gate electrode formed on the floating gate electrode with an interelectrode insulation film interposed between the floating gate electrode and the control gate electrode.

The control gate electrodes of the memory cells MT0 to MTn included in the NAND string NS are connected respectively to the word lines WL0 to WLn, each extending in the X direction, and the memory cells MTi (i=0 to n) in each NAND string NS are also commonly connected to each other through the same word lines WLi (i=0 to n). That is, the control gate electrodes of the memory cells MTi existing in the same row of the block BLK are connected to the same word line WLi. The (m+1) memory cells MTi connected to the same word line WLi are treated as a single page, and data are written and read page by page.

The bit lines BL0 to BLm are respectively connected to the drains of the (m+1) selection transistors ST1 within a single block BLK, and the selection gate line SGD is commonly connected to the gates of the (m+1) selection transistors ST1. Similarly, a source line SL is commonly connected to the sources of the (m+1) selection transistors ST2 within a single block BLK, and the selection gate line SGS is commonly connected to the gates of the (m+1) selection transistors ST2.

Although not shown in the drawings, a bit line BLj (j=0 to m) within a block BLK is commonly connected to the drain of the selection transistor ST1 together with bit lines BLj of other blocks BLKs. That is, the NAND strings NS arranged in the same column of a plurality of blocks BLKs are connected to each other through the same bit line BLj.

Figure 2A:
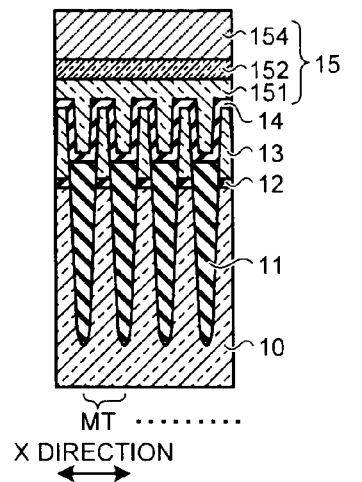
FIGS. 2A to 2C are cross-sectional views schematically illustrating an exemplary configuration of the nonvolatile semiconductor memory device according to a first embodiment.
Figure 2B:
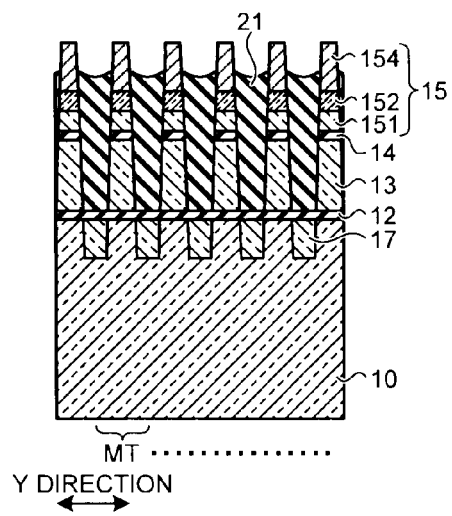
Figure 2C:
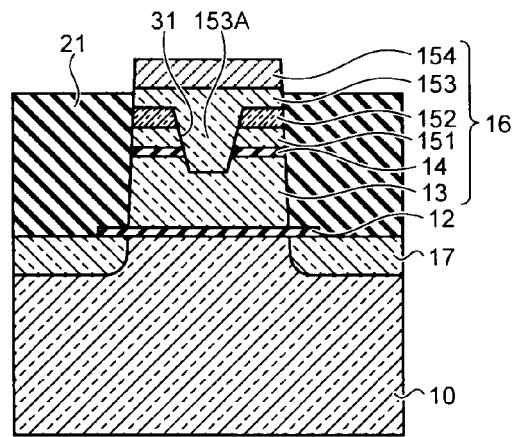

FIGS. 2A to 2C are cross-sectional views schematically illustrating an exemplary configuration of a nonvolatile semiconductor memory device according to a first embodiment. Specifically, FIG. 2A is a cross-sectional view taken along a direction (bit line direction) perpendicular to the extending direction of the word line of the memory cell, FIG. 2B is a cross-sectional view illustrating the memory cell in the word line extending direction (word line direction) in the memory cell, and FIG. 2C is a cross-sectional view illustrating a field effect transistor of the peripheral circuit (a peripheral circuit transistor).

As shown in FIGS. 2A and 2B, in the memory cell unit, a memory cell MT including a stack gate structure and source/drain regions 17 is formed. The stack gate structure is obtained by sequentially stacking a gate insulation film 12, a floating gate electrode 13, an interelectrode insulation film (Inter-Poly-Si Dielectrics film: IPD film) 14, and a control gate electrode 15 on the top surface of the semiconductor substrate 10 serving as a channel. The source/drain regions 17 are formed in the semiconductor substrate 10, at both sides of the stack gate structure in the Y direction. The channel of the memory cell MT, the gate insulation film 12, and the floating gate electrode 13 that are adjacent to each other in the X direction are isolated by the device isolation/insulation film 11 formed at predetermined intervals. In addition, it is structured such that the interelectrode insulation film 14 and the control gate electrode 15 are shared between adjacent memory cells MT with the device isolation/insulation film 11 interposed therebetween. Furthermore, the stack gate structures adjacent in the Y direction are isolated from each other by the interlayer insulation film 21. Here, the top surface of the control gate electrode 15 is higher than the top surface of the interlayer insulation film 21.

Here, a bulk silicon substrate or a silicon-on-insulator (SOI) substrate may be used as the semiconductor substrate 10, and a silicon oxide film having, for example, a thickness of 5 to 10 nm may be used as the gate insulation film 12. In addition, as the floating gate electrode 13, for example, a polycrystalline silicon film in which impurities of P, As, B, or the like are doped and which has a thickness of 40 to 100 nm or, for example, a nitride film having a thickness of approximately 5 to 20 nm may be used. As the interelectrode insulation film 14, for example, an oxide-nitride-oxide (ONO) film having a thickness of 10 to 13 nm, a metal oxide film such as $Al_2O_3$ or HfO, or a stacked film thereof may be used.

In addition, the control gate electrode 15 has a structure in which a semiconductor film 151, a silicide phase-change suppressing layer 152, and a silicide film 154 are sequentially stacked. The semiconductor film 151 is formed on the interelectrode insulation film 14 and is a polycrystalline silicon film or the like in which impurities of P, As, B, or the like are doped and which has a thickness of 40 to 60 nm. Most of the silicon grains of the semiconductor film 151 have an average grain diameter of approximately 250 nm or larger.

The silicide phase-change suppressing layer 152 includes a polycrystalline silicon film containing at least one element of C, F, or N that suppresses a phase-change reaction of the silicide during the silicidation of the control gate electrode 15 and suppresses the migration of the silicide metal. For example, the silicide phase-change suppressing layer 152 has a thickness of approximately 20 nm. In addition, the silicon grains forming the silicide phase-change suppressing layer 152 preferably have an average grain diameter equal to or smaller than 200 nm. In order to provide such a grain diameter, a concentration of the silicide phase-change suppressing impurities is preferably set to be equal to $1\times10^{20}$ [atom/cm$^3$] or higher, and to $5\times10^{21}$ [atom/cm$^3$] or lower. Specifically, if the concentration of the silicide phase-change suppressing impurities such as C, F, or N within the silicide phase-change suppressing layer 152 is set to about $1\times10^{20}$ [atom/cm$^3$], the average grain diameter of the silicon grains becomes 50 to 100 nm. If the concentration of the silicide phase-change suppressing impurities such as C, F, N within the silicide phase-change suppressing layer 152 is set to about $1\times10^{21}$ [atom/cm$^3$], the average grain diameter of the silicon grains becomes 10 to 20 nm. Therefore, it is possible to set the average grain diameter of the silicon grains to fall within a desired range by controlling the concentration of the silicide phase-change suppressing impurities. In addition, if the concentration of silicide phase-change suppressing impurities is lower than $1\times10^{20}$ [atom/cm$^3$], the effect of suppressing the phase change of the silicide is not sufficient. If the concentration of the silicide phase-change suppressing impurities is higher than $5\times10^{21}$ [atom/cm$^3$], the electrical resistance of the silicide phase-change suppressing layer 152 is higher than a suitable value for a device. Therefore, the concentration of the silicide phase-change suppressing impurities is preferably set to fall within the aforementioned range.

The silicide film 154 is formed on the silicide phase-change suppressing layer 152 and includes a silicide film such as a nickel silicide film or a cobalt silicide film, for example, with a thickness of 40 to 60 nm.

In this manner, if the silicide phase-change suppressing layer 152 is disposed at the depth of a predetermined value from the top surface of the control gate electrode 15, the silicidation reaction is suppressed by the silicide phase-change suppressing layer 152 as described below, and it is possible to achieve the uniform thickness of the silicide film 154. In addition, although the silicide phase-change suppressing layer 152 includes a polycrystalline silicon layer in which elements such as C, F, or N are doped, if the concentration of the elements such as C, F, or N is more than necessary, the activation rate of the impurities is reduced, which is likely to cause depletion. Therefore, the semiconductor film 151 including the polycrystalline silicon film in which impurities such as P, As, B, or the like are doped is provided in the lowermost layer of the control gate electrode 15 adjacent to the interelectrode insulation film 14.

As shown in FIG. 2C, in the peripheral circuit unit, a field effect transistor (FET) is formed. The FET includes the gate electrode 16 formed on the top surface of the semiconductor substrate 10 serving as a channel, with the gate insulation film 12 interposed between the semiconductor substrate 10 and the gate electrode 16, and source/drain regions 17 having a predetermined conductivity type, which are formed in the vicinity of the surface of the semiconductor substrate 10 at both longitudinal sides of the channel of the gate electrode 16. In addition, the area other than the location where the gate electrode 16 is disposed is filled up with the interlayer insulation film 21. Here, the top surface of the gate electrode 16 is made to be higher than top surface of the interlayer insulation film 21.

Alternatively, as the gate insulation film 12, a silicon oxide film, for example, having a thickness of 5 to 10 nm may be used. In addition, the gate electrode 16 has a structure in which a floating gate electrode 13, an interelectrode insulation film 14, a semiconductor film 151, a silicide phase-change suppressing layer 152, a semiconductor film 153, and a silicide film 154 are sequentially stacked. In addition, a passage 31 is provided at about the in-plane center portion of the interelectrode insulation film 14, the semiconductor film 151, and the silicide phase-change suppressing layer 152. The semiconductor film 153 is disposed so as to fill up the passage 31, thereby providing a contact portion 153A. As a result, the floating gate electrode 13 and the semiconductor film 153 are electrically connected to each other so as to serve as a single gate electrode 16.

As the floating gate electrode 13, for example, a polycrystalline silicon film in which impurities such as P, As, or B are doped and which has a thickness of 80 to 100 nm may be used. As the interelectrode insulation film 14, for example, an ONO film having a thickness of 10 to 13 nm, a metal oxide film such as $Al_2O_3$ or HfO, or a stacked film thereof may be used.

The semiconductor film 151 includes a polycrystalline silicon film in which impurities such as P, As, or B are doped and which has, for example, a thickness of 40 to 60 nm so as to correspond to the semiconductor film 151 of the control gate electrode 15 of the memory cell and the like. Most of the silicon grains forming the semiconductor film 151 have an average grain diameter of approximately 250 nm or larger.

The silicide phase-change suppressing layer 152 has the same function as the silicide phase-change suppressing layer 152 of the memory cell, so the films 152 are formed through the same process. For example, the silicide phase-change suppressing layer 152 in the periphery circuit unit has a thickness of approximately 20 nm and includes a polycrystalline silicon film in which at least one element of C, F, or N is doped.

The semiconductor film 153 includes a polycrystalline silicon film and the like in which impurities such as P, As, or B are doped, for example, with a thickness of 0 to 30 nm. Most of the silicon grains of the semiconductor film 153 have an average grain diameter of approximately 250 nm or larger. In addition, the silicide film 154 formed on the semiconductor film 153 includes a silicide film such as a nickel silicide film or a cobalt silicide film, for example, having a thickness of 5 to 50 nm. In addition, the memory cell unit and the peripheral circuit unit may have a different target thickness of the silicide film 154. For this reason, for example, in a case where the semiconductor film is to be fully-silicided, the thickness of the semiconductor film 153 is set to 0 nm, or the thickness of the semiconductor film 153 is set to 30 nm, so that the thickness of the silicide film 154 becomes 5 nm.

The contact portion 153A is formed of a semiconductor film including a polycrystalline silicon film in which P, As, B, and the like are doped so that the silicide phase-change suppressing layer 152 in which C, F, N, or the like is doped is not squeezed as described above. This is because the silicide phase-change suppressing layer 152 generally has a relatively high electrical resistance as compared with the polycrystalline silicon film in which P, As, B, and the like are doped, and, if it is squeezed into the contact portion 153A, the contact portion 153A is made to have a high electrical resistance.

Next, a method of manufacturing the nonvolatile semiconductor memory device having such a structure will be described. FIGS. 3A to 11C are cross-sectional views schematically illustrating an exemplary sequence of a method of manufacturing the nonvolatile semiconductor memory device according to the first embodiment. In these drawings, FIGS. 3A, 4A, 5A, 6A, 7A, 8A, 9A, 10A, and 11A illustrate cross sections along the bit line direction of the memory cell, FIGS. 3B, 4B, 5B, 6B, 7B, 8B, 9B, 10B, and 11B illustrate cross sections along the word line direction of the memory cell, and FIGS. 3C, 4C, 5C, 6C, 7C, 8C, 9C, 10C, and 11C illustrate cross sections of the peripheral circuit.

First, through a technique known in the art, the gate insulation film 12, the floating gate electrode 13, and the mask film are stacked over the semiconductor substrate 10 such as a silicon substrate. Then, after a line-and-space shaped pattern extending in the bit line direction is formed on the mask film of the memory cell, the gate insulation film 12 and the floating gate electrode 13 of the memory cell are etched through an anisotropic etching technique such as an reactive ion etching (RIE) by using the mask film as a mask, and the semiconductor substrate 10 is etched up to a predetermined depth.

Figure 3A:
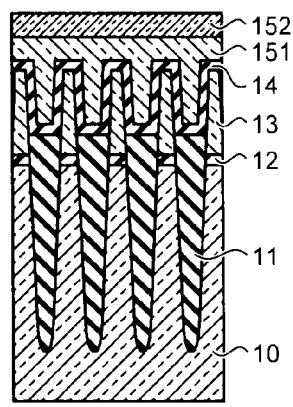
FIGS. 3A to 11C are cross-sectional views schematically illustrating an exemplary sequence of a method of manufacturing the nonvolatile semiconductor memory device according to the first embodiment.
Figure 3B:
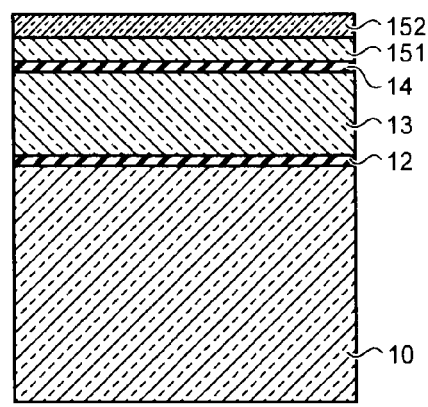
Figure 3C:
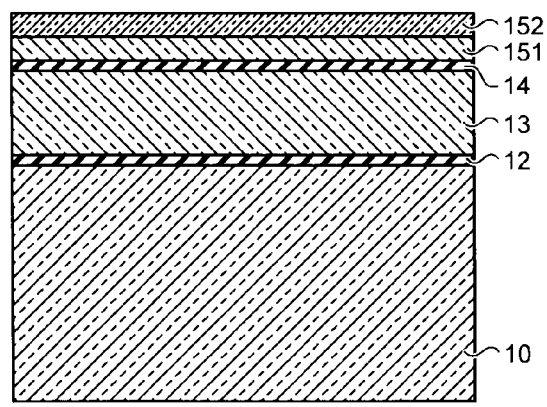

Then, a device isolation/insulation film 11 such as a silicon oxide film is embedded in the etched area, and etched back up to a predetermined depth. After removing the mask film, the interelectrode insulation film 14, the semiconductor film 151, and the silicide phase-change suppressing layer 152 are sequentially formed over the entire surface of the semiconductor substrate 10 through a film deposition technique such as a chemical vapor deposition (CVD) (FIGS. 3A to 3C). Here, as the semiconductor film 151, for example, a P-doped polycrystalline silicon film having a thickness of 20 to 40 nm may be used. In addition, as the silicide phase-change suppressing layer 152, for example, a polycrystalline silicon film in which silicide phase-change suppressing impurities such as C, F, or N are doped and which has a thickness of 20 nm may be used. The silicide phase-change suppressing layer 152 is formed by introducing the silicide phase-change suppressing impurities such as C, F, or N when the polycrystalline silicon film is formed. In this case, the silicide phase-change suppressing impurities are introduced with a concentration equal to or higher than $1 \times 10^{20}$ [atom/cm$^3$] and equal to or lower than $5 \times 10^{21}$ [atom/cm$^3$].

Figure 4A:
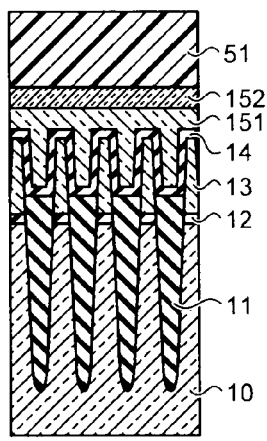
Figure 4B:
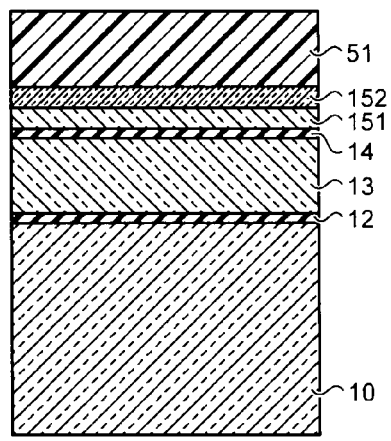
Figure 4C:
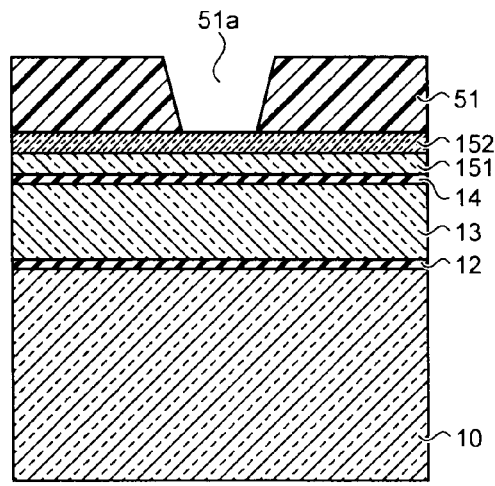
Figure 5A:
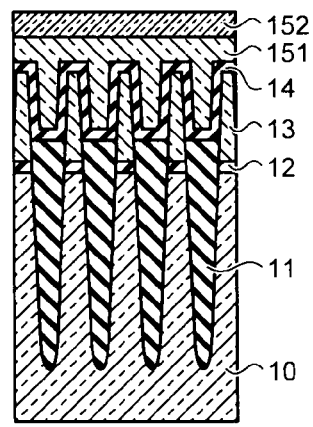
Figure 5B:
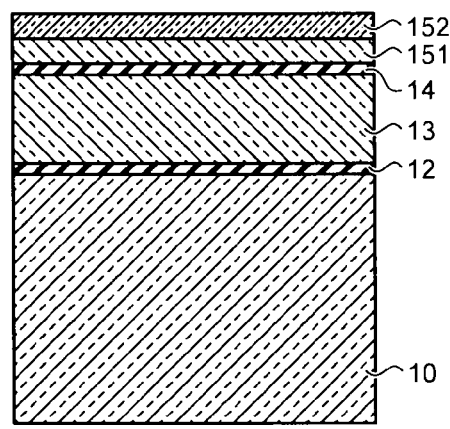
Figure 5C:
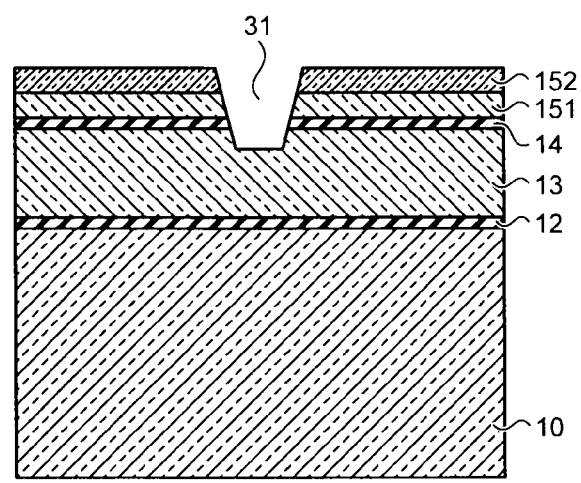

Then, a photoresist 51 is coated on the silicide phase-change suppressing layer 152, and a pattern having a passage 51a in a part of the area of the gate electrode of the peripheral circuit is formed through a photolithographic technique (FIGS. 4A to 4C). Then, etching is performed from the silicide phase-change suppressing layer 152 to a predetermined depth of the floating gate electrode 13 by using the photoresist 51 as a mask to form the passage 31 (FIGS. 5A to 5C).

Figure 6A:
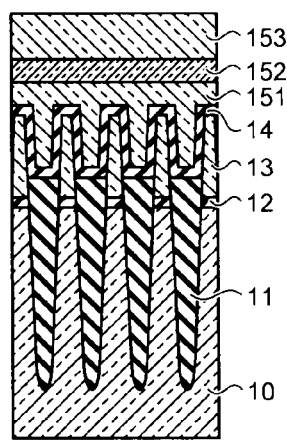
Figure 6B:
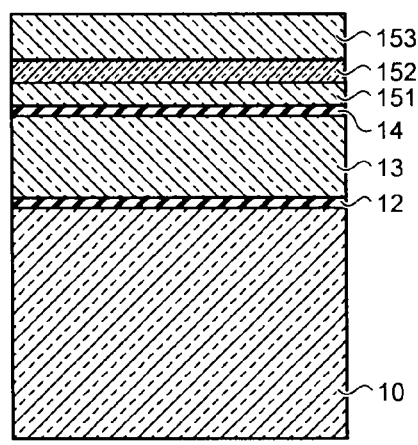
Figure 6C:
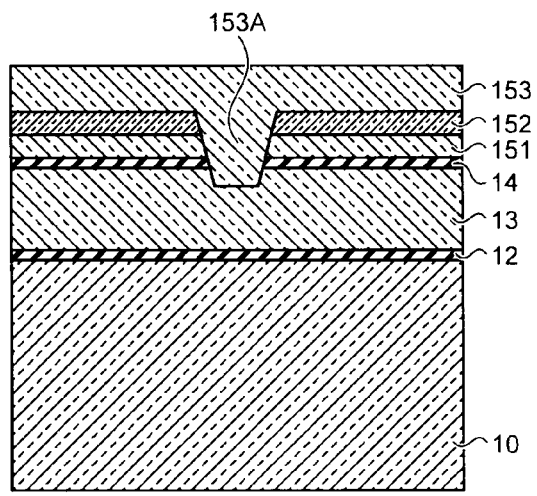

After removing the photoresist 51, the semiconductor film 153 is formed over the entire surface of the silicide phase-change suppressing layer 152 through a film deposition technique such as a CVD. In this case, in the peripheral circuit, a contact portion 153A is formed by the semiconductor film 153 embedded in the passage 31 (FIGS. 6A to 6C). As such a semiconductor film 153, for example, a P-doped polycrystalline silicon film having a thickness of 40 to 60 nm may be used.

Figure 7A:
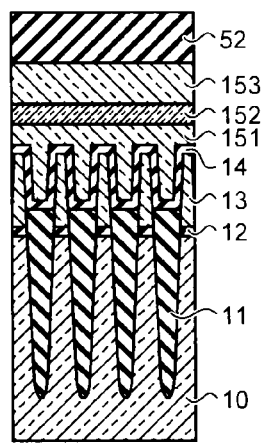
Figure 7B:
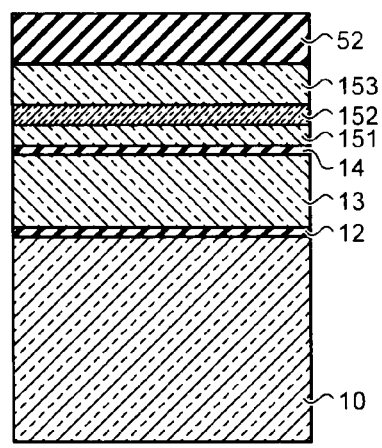
Figure 7C:
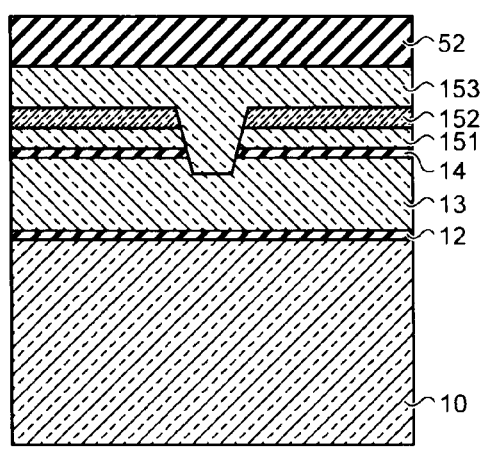

Then, after the mask film 52 is formed over the semiconductor film 153, heat treatment is carried out to grow crystal grains of the semiconductor film 151, the silicide phase-change suppressing layer 152, and the semiconductor film 153 (FIGS. 7A to 7C). For example, heat treatment is carried out at a temperature of 600° C. or higher. As a result, the silicon crystal grains of the semiconductor films 151 and 153 have a diameter of approximately 300 nm, and the silicon crystal grains of the silicide phase-change suppressing layer 152 have a diameter equal to or smaller than 200 nm. The diameter of the silicon crystal grains of the silicide phase-change suppressing layer 152 is reduced as the concentration of the silicide phase-change suppressing impurities increases. In addition, the mask film 52 is made of a material capable of providing an etching selection ratio between the semiconductor film 153 and the gate insulation film 12. For example, a silicon nitride film and the like having a thickness capable of etching from the semiconductor film 153 to the gate insulation film 12 in the subsequent process may be used.

Figure 8A:
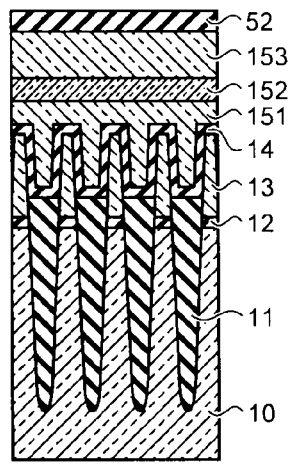
Figure 8B:
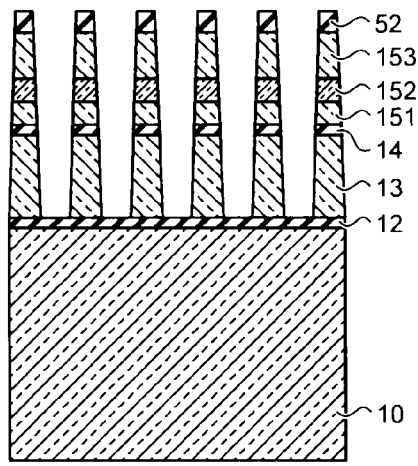
Figure 8C:
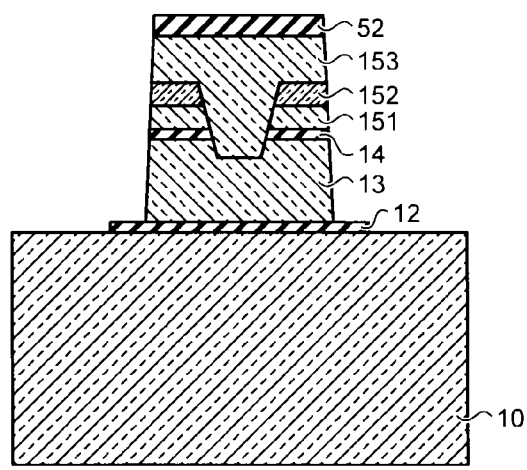

Then, a photoresist (not shown) is coated on the mask film 52. A line-and-space shaped pattern extending in the word line direction is formed in the memory cell unit through a photolithographic technique, and a predetermined gate electrode shaped pattern is formed in the peripheral circuit. Then, the pattern of the photoresist is transferred to the mask film 52, and the etching is performed from the semiconductor film 153 to the floating gate electrode 13 using the patterned mask film 52 through an etching technique such as an RIE (FIGS. 8A to 8C). As a result, in the memory cell, a stack gate structure including the gate insulation film 12, the floating gate electrode 13, the interelectrode insulation film 14, the semiconductor film 151, the silicide phase-change suppressing layer 152, and the semiconductor film 153 is formed over the channel region between the device isolation/insulation films 11. In addition, in the peripheral circuit, a gate structure including the gate insulation film 12, the floating gate electrode 13, the interelectrode insulation film 14, the semiconductor film 151, the silicide phase-change suppressing layer 152, and the semiconductor film 153 is formed over the channel region while the floating gate electrode 13 and the semiconductor film 153 are connected to each other by the passage 31 provided in the interelectrode insulation film 14, the semiconductor film 151, and the silicide phase-change suppressing layer 152. Then, the gate insulation film 12 of the peripheral circuit is etched in a predetermined shape using a photoresist (not shown).

Figure 9A:
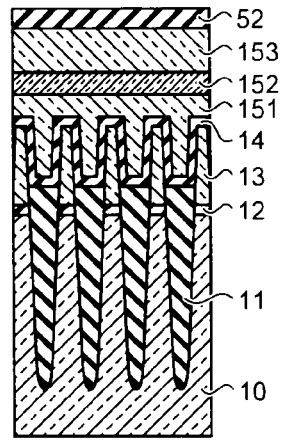
Figure 9B:
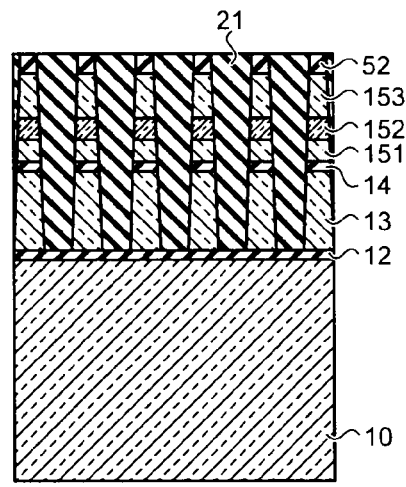
Figure 9C:
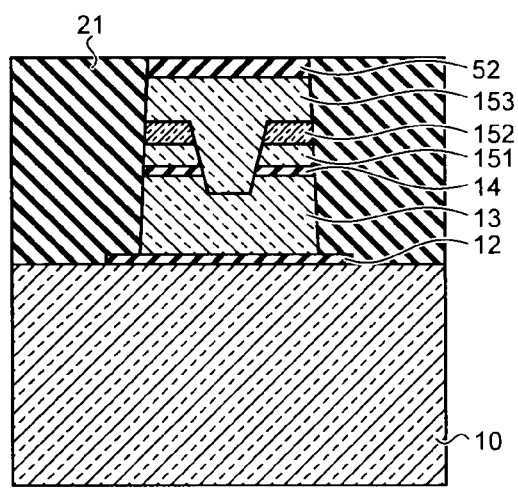
Figure 10A:
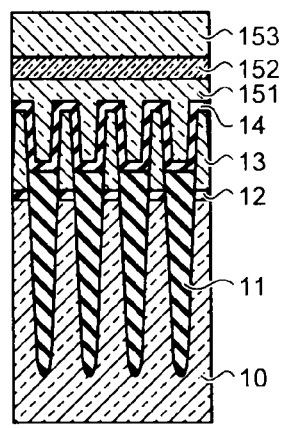
Figure 10B:
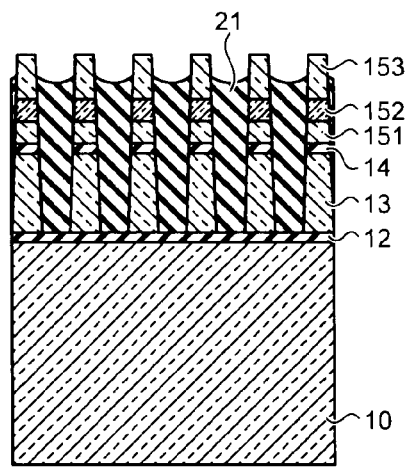
Figure 10C:
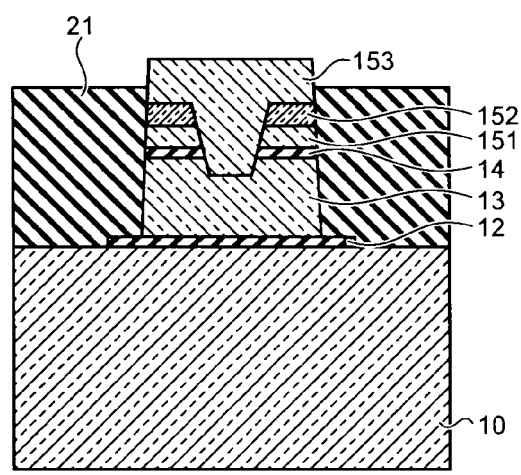

Then, the interlayer insulation film 21 is formed to embed the etched area and be higher than the top surface of the mask film 52, and then, the interlayer insulation film 21 formed to be higher than the top surface of the mask film 52 is removed through a chemical mechanical polishing (CMP) by using the mask film 52 as a stopper (FIGS. 9A to 9C). As the interlayer insulation film 21, for example, a silicon oxide film may be used. Then, the mask film 52 is removed through an RIE technique, a wet process, or the like (FIGS. 10A to 10C). As a result, in the memory cell and the peripheral circuit, the vicinity of the top portion of the semiconductor film 153 is protruded over the top surface of the interlayer insulation film 21.

Figure 11A:
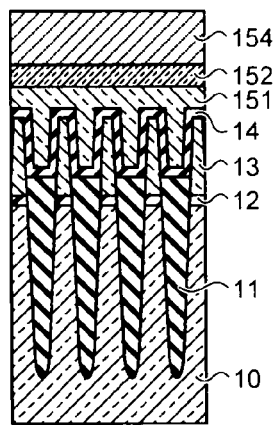
Figure 11B:
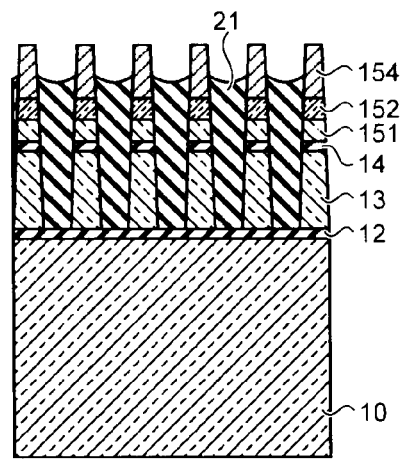
Figure 11C:
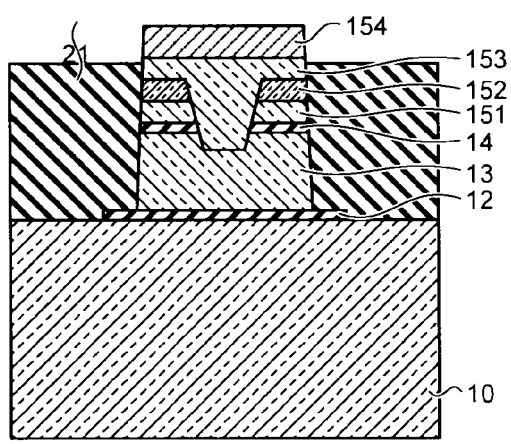

Then, a metal film capable of being silicided by reacting with silicon is formed over the entire surface of the semiconductor substrate 10 through a film deposition technique such as sputtering, and heat treatment is carried out to silicide the semiconductor film 153 so that a silicide film 154 is formed (FIGS. 11A to 11C). As the metal film, for example, Ni, Co, W, and the like may be used. During the heat treatment, silicidation is progressed from an interface between the semiconductor film 153 and the metal film. However, silicidation of silicon is suppressed by means of the silicide phase-change suppressing layer 152. That is, the silicidation is not progressed up to the interelectrode insulation film 14, and stops in the vicinity of the position of the silicide phase-change suppressing layer 152. As a result, the thickness of the silicide film 154 can be controlled substantially uniformly within the area of the memory cell unit.

Then, an unreacted part of the metal film is removed, and impurity ions having a predetermined conductivity type are implanted onto the surface of the semiconductor substrate 10 in both sides along the bit line direction of the stack gate structure in the memory cell and onto the surface of the semiconductor substrate 10 along the longitudinal direction of the channel of the gate structure in the peripheral circuit, and activated so that the nonvolatile semiconductor memory device having a structure shown in FIGS. 2A to 2C is obtained.

Figure 12:
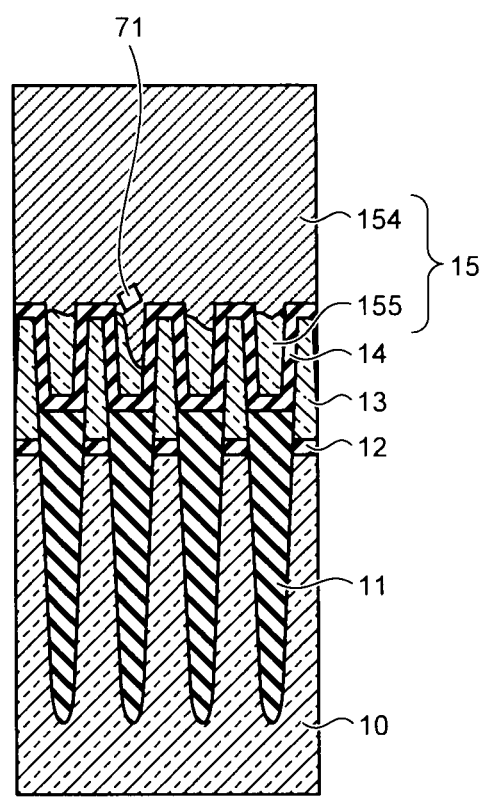
FIG. 12 is a partially cross-sectional view schematically illustrating a nonvolatile semiconductor memory device according to a comparative example.

FIG. 12 is a partially cross-sectional view schematically illustrating a nonvolatile semiconductor memory device according to a comparative example. Here, a cross section of the memory cell is illustrated along the word line direction. In the nonvolatile semiconductor memory device according to the comparative example, the control gate electrode 15 is formed by siliciding the semiconductor film 155 including a polycrystalline silicon film in which impurities such as P, As, or B are doped, and which has a structure obtained by stacking the semiconductor film 155 and the silicide film 154. In addition, since the structures of other parts are similar to those of the first embodiment, like reference numerals denote like elements, and description thereof will be omitted.

In a typical silicide formation process, after the semiconductor film 155 in which impurities such as P, As, or B are doped is formed, a part thereof is silicided through a silicidation process so that a control gate electrode 15 (word line) having a low electrical resistance is formed. However, since heat is added in the thermal processes after the silicide is formed (for example, an activation annealing process after the contact is formed, an annealing process for forming silicide on the bottom of the contact, and a side-wall transfer process in the bit line wiring process), the phase of the silicide film 154 is changed (for example, NiSi→NiSi$_2$). As a result, a volume is changed, and voids 71 may be generated in the lower portion of the control gate electrode 15. Particularly, in a case where the silicide film 154 reaches the vicinity of the interelectrode insulation film 14, the voids 71 hang up to the interelectrode insulation film 14. Therefore, a coupling ratio is reduced due to the voids 71, and an error may occur in writing. Although not shown in the drawing, since the peripheral circuit has a wider wiring width than that of the memory cell, the silicide film 154 is formed to have a thickness smaller than that of the silicide film 154 of the control gate electrode 15 of the memory cell. For this reason, agglomeration is apt to more significantly occur in the subsequent thermal process.

In contrast, according to the first embodiment, since the silicide phase-change suppressing layer 152 is disposed in the intermediate layer of the control gate electrode 15, it is possible to suppress silicidation of the polycrystalline silicon film under the silicide phase-change suppressing layer 152 of the control gate electrode 15. That is, according to the first embodiment, since the silicide phase-change suppressing layer 152 is provided to be higher than the interelectrode insulation film 14, silicidation stops at the position where the silicide phase-change suppressing layer 152 is formed, and the silicidation does not reach the interelectrode insulation film 14. As a result, it is possible to maintain the thickness of the silicide film 154 to be substantially constant in the area of the memory cell unit. In addition, since migration of silicide atoms is suppressed in the thermal process after the silicide is formed, it is possible to suppress voids 71 from being generated under the control gate electrode 15 as the volume of the silicide film 154 is changed. That is, it is possible to make an interface between the silicide film 154 and the silicide phase-change suppressing layer 152 uniform, improve a heat resistance of the silicide film 154, and provide a structure resistant to voids 71 or agglomeration in the subsequent thermal process.

In addition, depletion may occur in elements such as C, F, or N contained in the silicide phase-change suppressing layer 152 because an activation rate of the impurity decreases in a high concentration. Therefore, the lowermost layer of the control gate electrode 15 adjacent to the interelectrode insulation film 14 is formed of a semiconductor film 151 including the polycrystalline silicon film in which P, As, B, or the like are doped so that generation of depletion is suppressed.

Second Embodiment

Figure 13A:
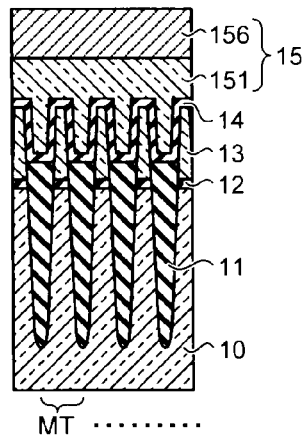
FIGS. 13A to 13C are cross-sectional views schematically illustrating an exemplary configuration of the nonvolatile semiconductor memory device according to a second embodiment.
Figure 13B:
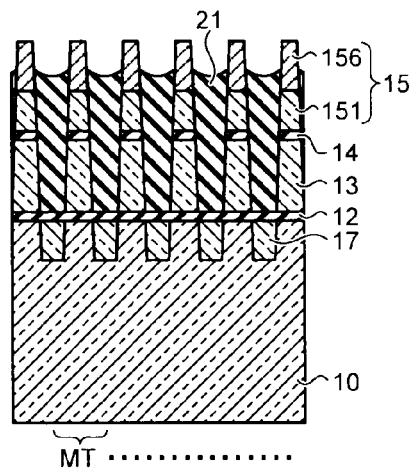
Figure 13C:
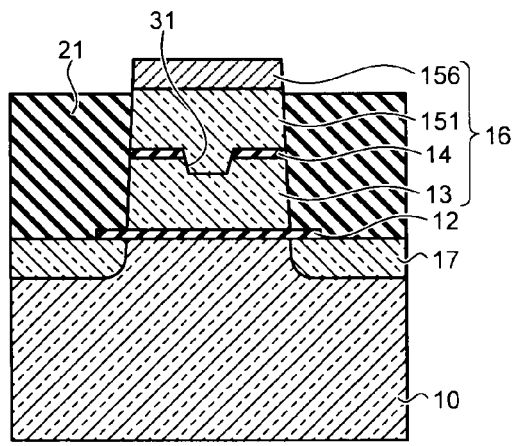

FIGS. 13A to 13C are cross-sectional views schematically illustrating an exemplary configuration of the nonvolatile semiconductor memory device according to a second embodiment. FIG. 13A is a cross-sectional view taken along the direction perpendicular to the word line extending direction of the memory cell, FIG. 13B is a cross-sectional view taken along the word line extending direction of the same memory cell, and FIG. 13C is a cross-sectional view illustrating the peripheral circuit transistor. According to the second embodiment, since the structures of the corresponding parts of the control gate electrode 15 of the memory cell and the control gate electrode 15 of the peripheral circuit are different from those of the first embodiment, description will be made only for the parts different from those of the first embodiment.

As shown in FIGS. 13A and 13B, the control gate electrode 15 of the memory cell has a structure obtained by sequentially stacking the semiconductor film 151 and the silicide film 156. Similar to the first embodiment, the semiconductor film 151 includes a polycrystalline silicon film in which impurities such as P, As, or B are doped and, for example, which has a thickness of 40 to 60 nm. Most of the silicon grains of the semiconductor film 151 has an average grain diameter of approximately 250 nm or larger.

In addition, the silicide film 156 includes a silicide film in which at least one of C, F, or N is doped. Specifically, the silicide film 156 is made of a film obtained by siliciding the polycrystalline silicon film in which the silicide phase-change suppressing impurities such as C, F, or N are doped. In addition, the thickness of the silicide film 156 may be set to, for example, 20 nm. Similar to the first embodiment, the silicide phase-change suppressing impurities act to suppress a silicide phase-change reaction and migration of silicide metal.

In addition, as shown in FIG. 13C, the gate electrode 16 of the peripheral circuit has a structure obtained by sequentially stacking the floating gate electrode 13, the interelectrode insulation film 14, the semiconductor film 151, and the silicide film 156 over the gate insulation film 12. The silicide film 156 includes a silicide film in which the silicide phase-change suppressing impurities such as C, F, or N are doped.

According to the second embodiment, the silicide phase-change suppressing impurities are introduced into the upper-most or outermost layer side of the control gate electrode 15 or the gate electrode 16. In this case, although the word line (control gate electrode 15) obtained after the silicide is formed may have a high electrical resistance, it is possible to suppress the electrical resistance of the silicide film to be 1.5 times or smaller a case where an silicide phase-change suppressing impurity is not contained, by limiting the concentration of the silicide phase-change suppressing impurities such as C, F, or N of the silicide film 156 to $1 \times 10^{21}$ [atoms/cm$^3$] or lower.

In addition, although the drawings illustrate a case where the silicide film 156 is formed over the semiconductor film 151, the silicide phase-change suppressing layer including the polycrystalline silicon film in which the phase-change suppressing impurities are doped may exist between the semiconductor film 151 and the silicide film 156.

Next, a method of manufacturing the nonvolatile semiconductor memory device having such a structure will be described. FIGS. 14A to 22C are cross-sectional views schematically illustrating an exemplary sequence of a method of manufacturing the nonvolatile semiconductor memory device according to the second embodiment. In these drawings, FIGS. 14A, 15A, 16A, 17A, 18A, 19A, 20A, 21A, and 22A illustrate cross sections along the bit line direction of the memory cell, FIGS. 14B, 15B, 16B, 17B, 18B, 19B, 20B, 21B, and 22B illustrate cross sections along the word line direction of the memory cell, and FIGS. 14C, 15C, 16C, 17C, 18C, 19C, 20C, 21C, and 22C illustrate cross sections of the peripheral circuit.

First, through a technique known in the art, the gate insulation film 12, the floating gate electrode 13, and the mask film are sequentially stacked over the semiconductor substrate 10 such as the silicon substrate. Then, a line-and-space shaped pattern extending in the bit line direction is formed in the mask film of the memory cell. Then, the gate insulation film 12 and the floating gate electrode 13 of the memory cell are etched through an anisotropic etching technique such as a RIE by using the mask film as a mask, and the semiconductor substrate 10 is etched up to a predetermined depth.

Figure 14A:
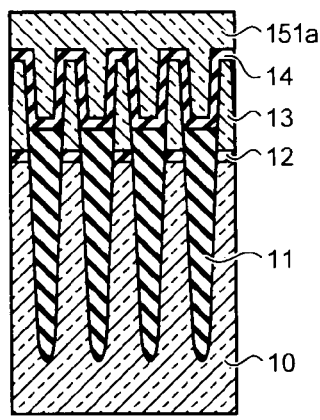
FIGS. 14A to 22C are cross-sectional views schematically illustrating an exemplary sequence of a method of manufacturing the nonvolatile semiconductor memory device according to the second embodiment.
Figure 14B:
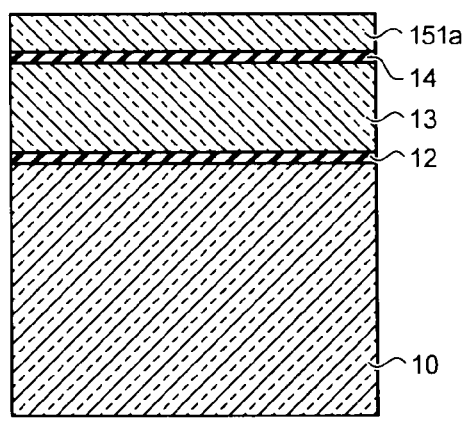
Figure 14C:
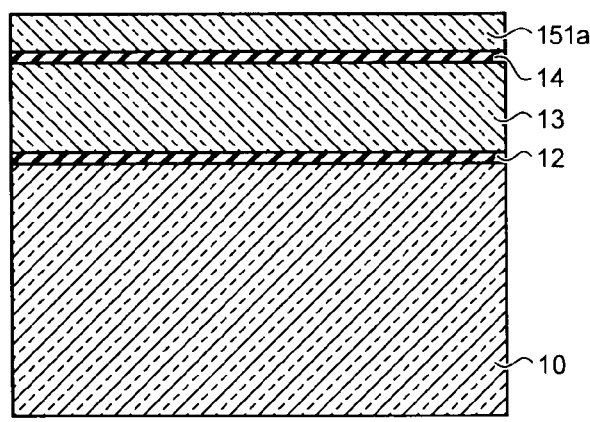

Then, the device isolation/insulation film 11 such as a silicon oxide film is embedded in the etched area and etched back up to a predetermined depth. After removing the mask film, the interelectrode insulation film 14 and the first semiconductor film 151a are sequentially formed over the entire surface of the semiconductor substrate 10 through a film deposition technique such as a CVD (FIGS. 14A to 14C). Here, as the first semiconductor film 151a, for example, a P-doped polycrystalline silicon film may be used.

Figure 15A:
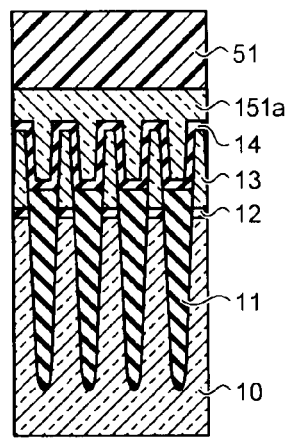
Figure 15B:
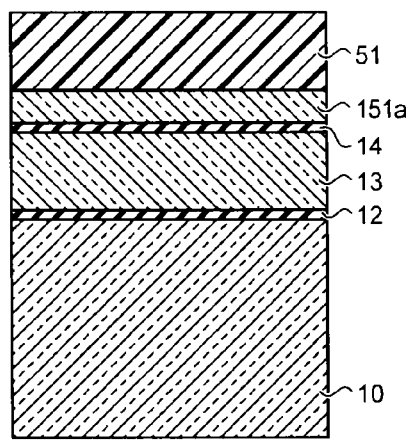
Figure 15C:
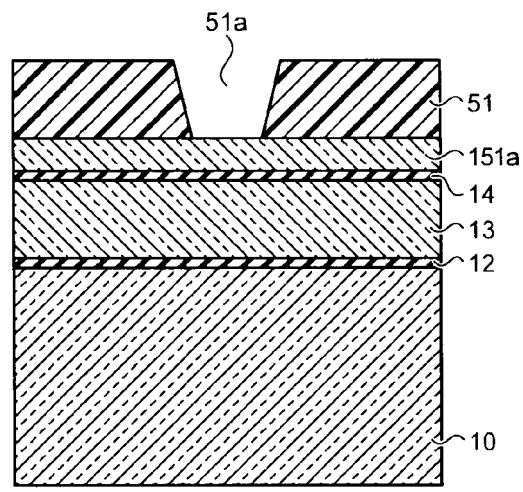
Figure 16A:
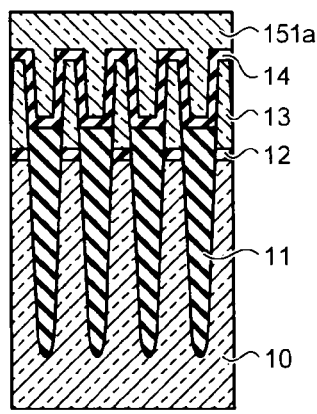
Figure 16B:
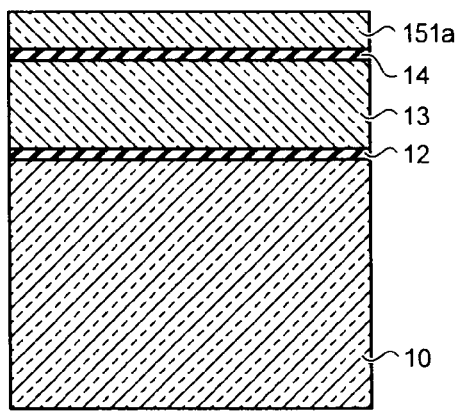
Figure 16C:
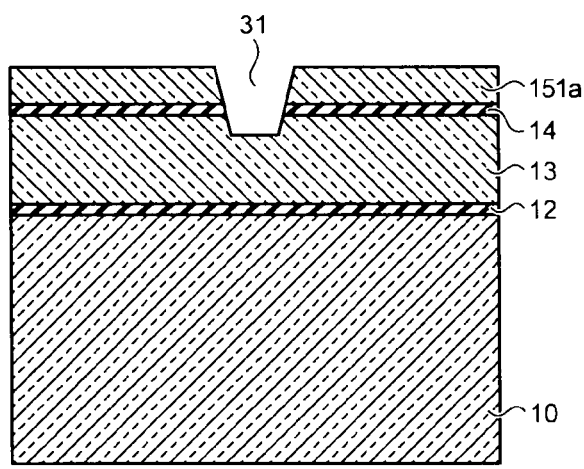

Then, the photoresist 51 is coated on the first semiconductor film 151a, and a pattern having a passage 51a in a part of the area of the gate electrode of the peripheral circuit is formed through a photolithographic technique (FIGS. 15A to 15C). Then, etching is performed from the first semiconductor film 151a to the floating gate electrode 13 up to a predetermined depth by using this photoresist 51 as a mask to form the passage 31 (FIGS. 16A to 16C).

Figure 17A:
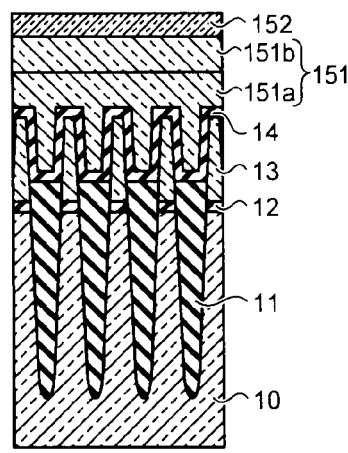
Figure 17B:
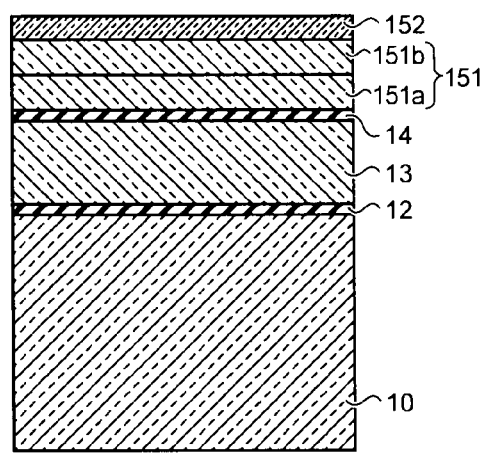
Figure 17C:
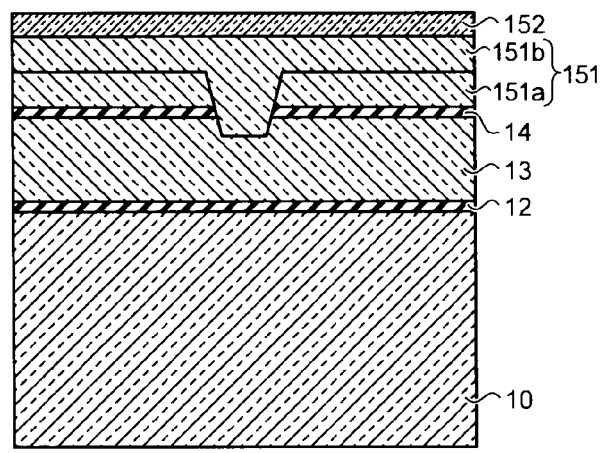

After removing the photoresist 51, the second semiconductor film 151b and the silicide phase-change suppressing layer 152 are sequentially formed over the entire surface of the first semiconductor film 151a through a film deposition technique such as a CVD. In this case, in the peripheral circuit, the second semiconductor film 151b is formed to embed the passage 31 (FIGS. 17A to 17C). As the second semiconductor film 151b, for example, a P-doped polycrystalline silicon film may be used. In addition, the semiconductor film 151 may include the first and second semiconductor films 151a and 151b, and the semiconductor film 151 may have a thickness of, for example, 40 to 60 nm. As one of the silicide phase-change suppressing layers 152, for example, a polycrystalline silicon film in which silicide phase-change suppressing impurities such as C, F, or N are doped and which has a thickness of, for example, 20 nm may be used. The silicide phase-change suppressing layer 152 may be formed by introducing the silicide phase-change suppressing impurities such as C, F, or N when the polycrystalline silicon film is formed. In this case, the silicide phase-change suppressing impurities are introduced to have a concentration of $1 \times 10^{21}$ [atom/cm$^3$] or lower.

Figure 18A:
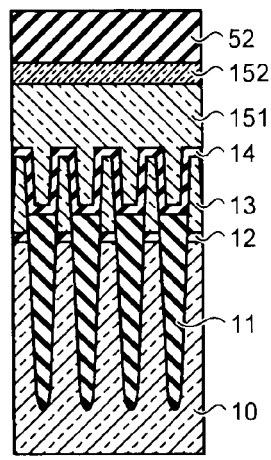
Figure 18B:
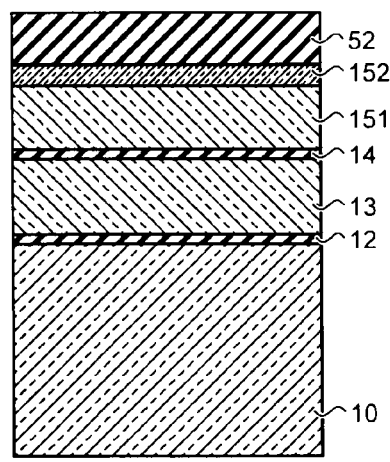
Figure 18C:
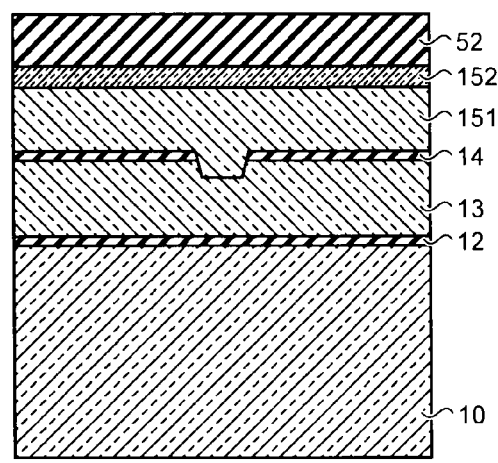

Then, after the mask film 52 is formed over the silicide phase-change suppressing layer 152, heat treatment is carried out to grow crystal grains contained in the semiconductor film 151 and the silicide phase-change suppressing layer 152 (FIGS. 18A to 18C). For example, the heat treatment is carried out at a temperature of 600° C. or higher. As a result, for example, the silicon crystal grains of the semiconductor film 151 have a diameter of approximately 300 nm, and the silicon crystal grains of the silicide phase-change suppressing layer 152 have a diameter equal to or smaller than 200 nm. The diameter of silicon crystal grains of the silicide phase-change suppressing layer 152 is reduced as the concentration of the silicide phase-change suppressing impurities increases. In addition, the mask film 52 is made of a material capable of providing an etching selection ratio between the silicide phase-change suppressing layer 152 and the gate insulation film 12. For example, a silicon nitride film and the like having a thickness capable of etching from the silicide phase-change suppressing layer 152 to the gate insulation film 12 in the subsequent process may be used.

Figure 19A:
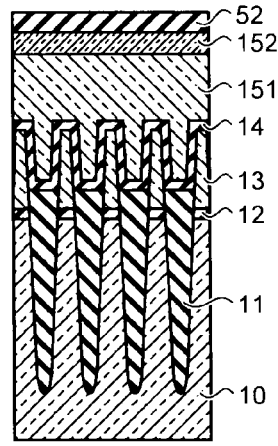
Figure 19B:
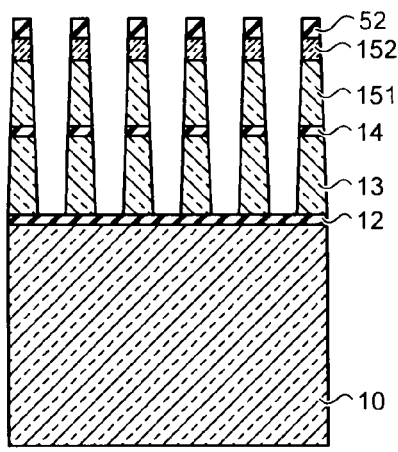
Figure 19C:
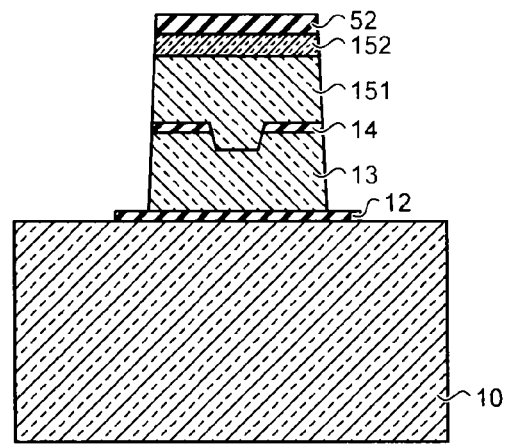

Then, a photoresist (not shown) is coated on the mask film 52. A line-and-space shaped pattern extending in the word line direction is formed in the memory cell unit through a photolithographic technique, and a predetermined gate electrode shaped pattern is formed in the peripheral circuit. Then, the pattern of the photoresist is transferred to the mask film 52, and the etching is performed from the silicide phase-change suppressing layer 152 to the floating gate electrode 13 using the patterned mask film 52 through an etching technique such as an RIE (FIGS. 19A to 19C). As a result, in the memory cell, a stack gate structure including the gate insulation film 12, the floating gate electrode 13, the interelectrode insulation film 14, the semiconductor film 151, and the silicide phase-change suppressing layer 152 is formed over the channel region between the device isolation/insulation films 11. In addition, in the peripheral circuit, a gate structure including the gate insulation film 12, the floating gate electrode 13, the interelectrode insulation film 14, the semiconductor film 151, and the silicide phase-change suppressing layer 152 is formed over the channel region while the floating gate electrode 13 and the semiconductor film 153 are connected by the passage 31 provided in the interelectrode insulation film 14. Then, the gate insulation film 12 of the peripheral circuit is etched in a predetermined shape using a photoresist (not shown).

Figure 20A:
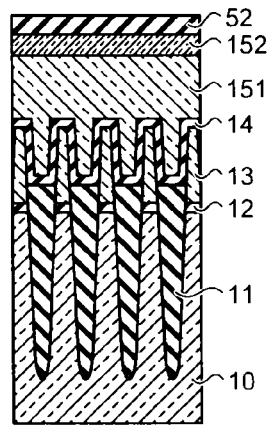
Figure 20B:
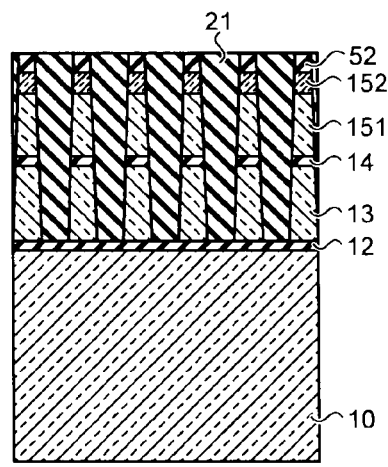
Figure 20C:
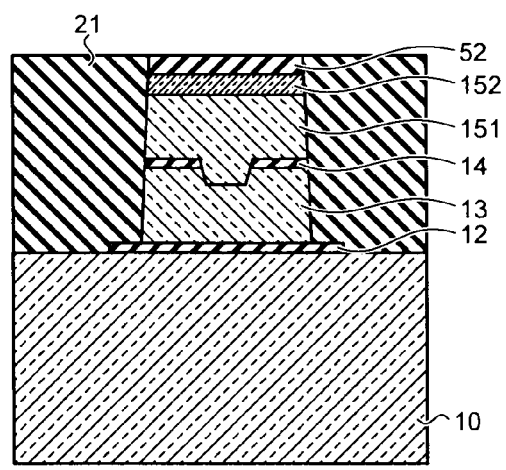
Figure 21A:
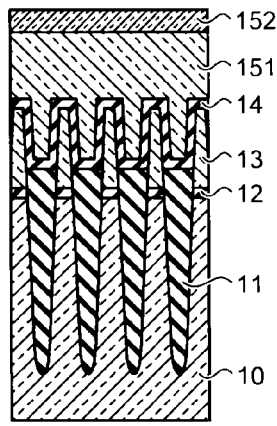
Figure 21B:
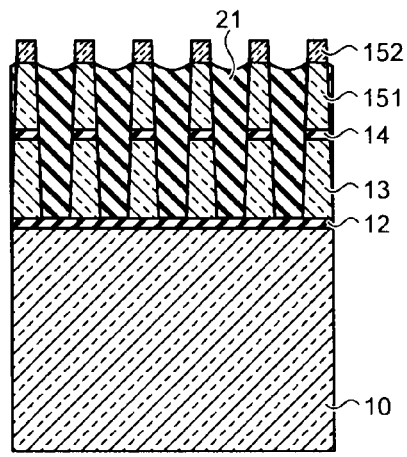
Figure 21C:
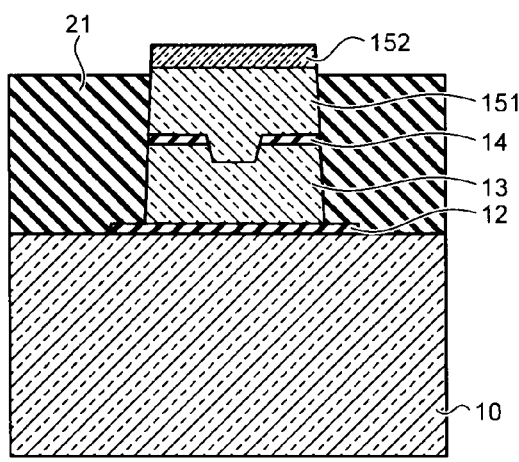

Then, the interlayer insulation film 21 is formed to embed the etched area and be higher than the top surface of the mask film 52, and then, the interlayer insulation film 21 formed to be higher than the top surface of the mask film 52 is removed through a CMP technique by using the mask film 52 as a stopper (FIGS. 20A to 20C). As the interlayer insulation film 21, for example, a silicon oxide film may be used. Then, the mask film 52 is removed through an RIE technique, a wet process, or the like (FIGS. 21A to 21C). As a result, in the memory cell and the peripheral circuit, the silicide phase-change suppressing layer 152 is exposed.

Figure 22A:
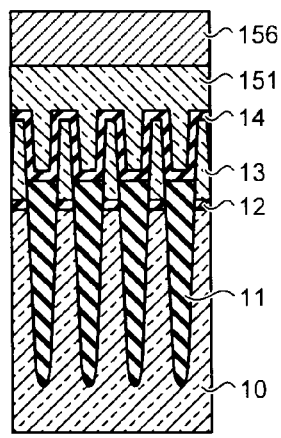
Figure 22B:
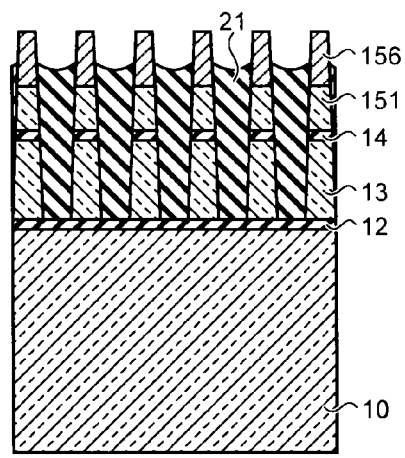
Figure 22C:
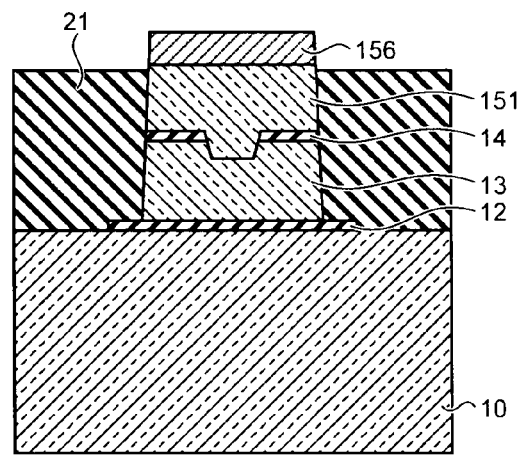

Then, a metal film capable of being silicided by reacting with silicon is formed over the entire surface of the semiconductor substrate 10 through a film deposition technique such as sputtering, and heat treatment is carried out to silicide the silicide phase-change suppressing layer 152 so that a silicide film 156 is formed (FIGS. 22A to 22C). As the metal film, for example, Ni, Co, W, and the like may be used. During the heat treatment, silicidation is progressed from the top surface of the silicide phase-change suppressing layer 152. However, silicidation of silicon is suppressed by means of the silicide phase-change suppressing layer 152. That is, the silicidation stops in the vicinity of the interface with the semiconductor film 151.

As a result, the thickness of the silicide film 154 can be controlled substantially uniformly within the area of the memory cell unit.

Then, an unreacted part of the metal film is removed, and impurity ions having a predetermined conductivity type are implanted onto the surface of the semiconductor substrate 10 in both sides along the bit line direction of the stack gate structure in the memory cell and the surface of the semiconductor substrate 10 along the longitudinal direction of the channel of the gate structure in the peripheral circuit, and activated so that the nonvolatile semiconductor memory device having a structure shown in FIGS. 13A to 13C is obtained.

According to the second embodiment, the silicide film 156 obtained by siliciding the silicide phase-change suppressing layer 152 is provided in the upper layer side of the control gate electrode 15 in the memory cell and the upper layer side of the gate electrode of the peripheral circuit. If the silicide phase-change suppressing impurities are contained in the silicide film 156, a heat resistance of the silicide film 156 is improved, and agglomeration or contraction is rarely generated in the silicide film 156. As a result, it is possible to improve a resistance to agglomeration in the subsequent thermal process for the silicide film 156 of the peripheral circuit which has a silicide thickness smaller than that of the memory cell.

Third Embodiment

Figure 23A:
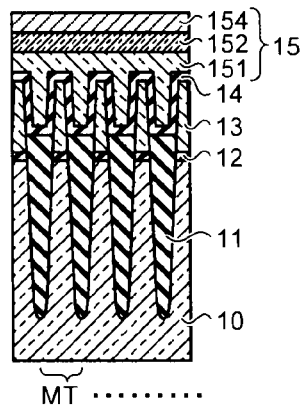
FIGS. 23A to 23C are cross-sectional views schematically illustrating an exemplary configuration of a nonvolatile semiconductor memory device according to a third embodiment.
Figure 23B:
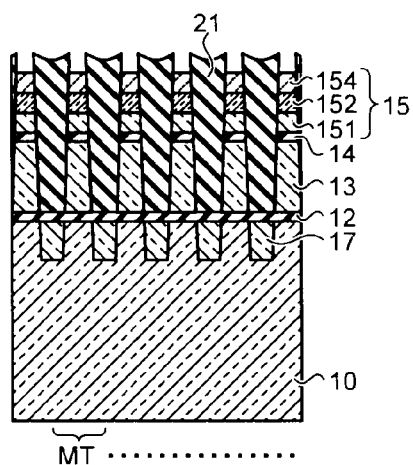
Figure 23C:
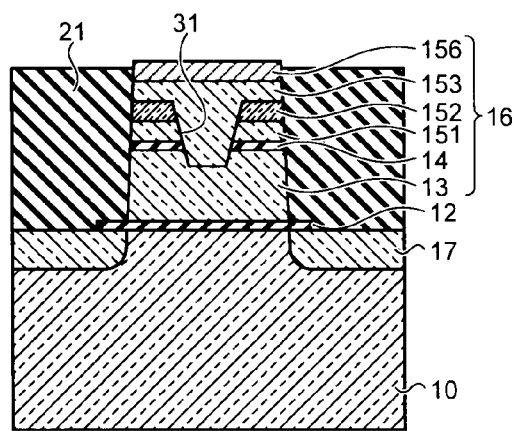

FIGS. 23A to 23C are cross-sectional views schematically illustrating an exemplary configuration of the nonvolatile semiconductor memory device according to the third embodiment. FIG. 23A is a cross-sectional view taken along the direction perpendicular to the word line extending direction of the memory cell, FIG. 23B is a cross-sectional view taken along the word line extending direction of the same memory cell, and FIG. 23C is a cross-sectional view illustrating the peripheral circuit transistor. According to the third embodiment, since the structures of the corresponding parts of the control gate electrode 15 of the memory cell and the control gate electrode 16 of the peripheral circuit are different from those of the first embodiment, description will be made for the parts different from those of the first embodiment.

Although the control gate electrode 15 of the memory cell has the same structure as that of the control gate electrode 15 of the memory cell according to the first embodiment as shown in FIGS. 23A and 23B, the top surface of the interlayer insulation film 21 is higher than the top surface of the control gate electrode 15, for example, by 5 nm or longer.

In addition, the gate electrode 16 of the peripheral circuit has a structure obtained by sequentially stacking the floating gate electrode 13, the interelectrode insulation film 14, the semiconductor film 151, the silicide phase-change suppressing layer 152, the semiconductor film 153, and the silicide film 156 over the gate insulation film 12 as shown in FIG.

23C. The silicide film 156 includes a silicide film in which silicide phase-change suppressing impurities such as C, F, or N are doped. In addition, the top surface of the interlayer insulation film 21 is formed to be lower than the top surface of the gate electrode 16.

In this manner, according to the third embodiment, the silicide phase-change suppressing layer 152 is disposed in the intermediate layer of the control gate electrode 15 of the memory cell, and the silicide phase-change suppressing layer 152 is disposed in the intermediate layer of the gate electrode 16 of the peripheral circuit. In addition, the silicide film 156 in which the silicide phase-change suppressing impurities are doped is disposed in the top layer or the outermost layer.

Next, a method of manufacturing the nonvolatile semiconductor memory device having such a structure will be described. FIGS. 24A to 34C are cross-sectional views schematically illustrating an exemplary sequence of a method of manufacturing the nonvolatile semiconductor memory device according to the third embodiment. In these drawings, FIGS. 24A, 25A, 26A, 27A, 28A, 29A, 30A, 31A, 32A, 33A, and 34A illustrate cross sections along the bit line direction of the memory cell, FIGS. 24B, 25B, 26B, 27B, 28B, 29B, 30B, 31B, 32B, 33B, and 34B illustrate cross sections along the word line direction of the memory cell, and FIGS. 24C, 25C, 26C, 27C, 28C, 29C, 30C, 31C, 32C, 33C, and 34C illustrate cross sections of the peripheral circuit.

First, through a method known in the art, the gate insulation film 12, the floating gate electrode 13, and the mask film are sequentially stacked over the semiconductor substrate 10 such as the silicon substrate. Then, a line-and-space shaped pattern extending in the bit line direction is formed in the mask film of the memory cell. Then, the gate insulation film 12 and the floating gate electrode 13 of the memory cell are etched through an anisotropic etching technique such as a RIE by using the mask film as a mask, and the semiconductor substrate 10 is etched up to a predetermined depth.

Figure 24A:
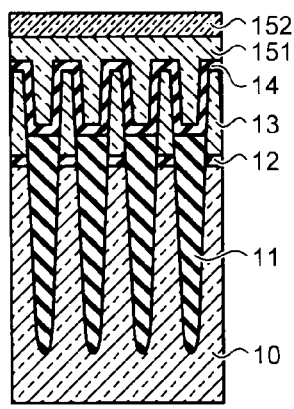
FIGS. 24A to 34C are cross-sectional views schematically illustrating an exemplary sequence of a method of manufacturing the nonvolatile semiconductor memory device according to the third embodiment.
Figure 24B:
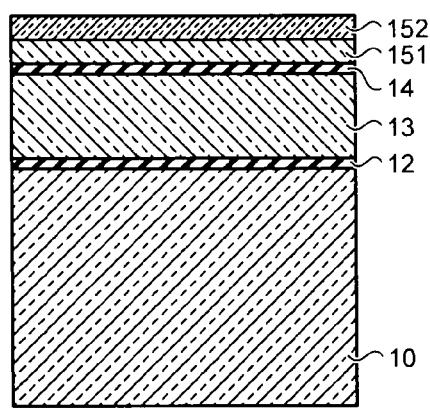
Figure 24C:
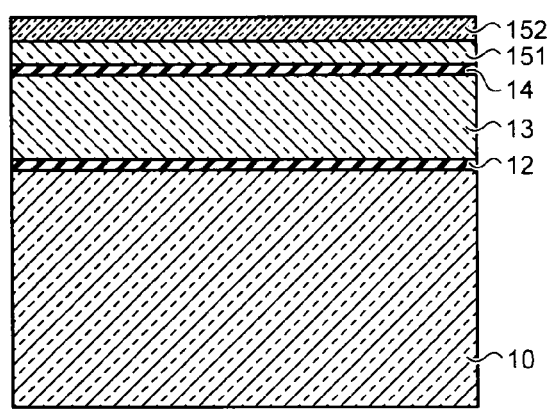

Then, the device isolation/insulation film 11 such as a silicon oxide film is embedded in the etched area and etched back up to a predetermined depth. After removing the mask film, the interelectrode insulation film 14, the semiconductor film 151, and the silicide phase-change suppressing layer 152 are sequentially formed over the entire surface of the semiconductor substrate 10 through a film deposition technique such as a CVD (FIGS. 24A to 24C). Here, as the first semiconductor film 151, for example, a P-doped polycrystalline silicon film having a thickness of 20 to 40 nm may be used. In addition, as the silicide phase-change suppressing layer 152, for example, a polycrystalline silicon film in which silicide phase-change suppressing impurities such as C, F, or N are doped and which has a thickness of 20 nm may be used. The silicide phase-change suppressing layer 152 is formed by introducing the silicide phase-change suppressing impurities such as C, F, or N when the polycrystalline silicon film is formed. In this case, the silicide phase-change suppressing impurities are introduced with a concentration of $1 \times 10^{20}$ [atom/cm$^3$] or higher or $5 \times 10^{21}$ [atom/cm$^3$] of lower.

Figure 25A:
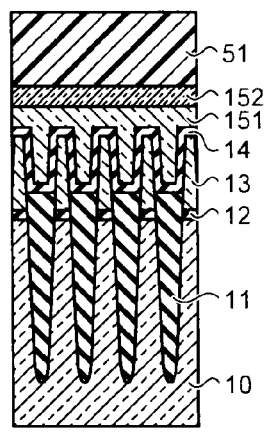
Figure 25B:
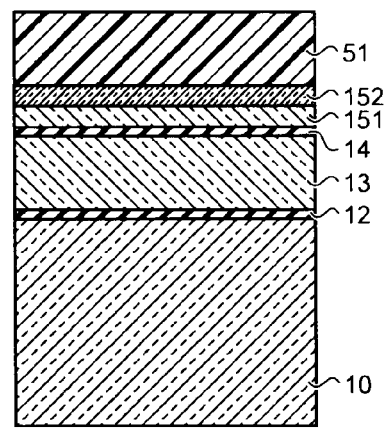
Figure 25C:
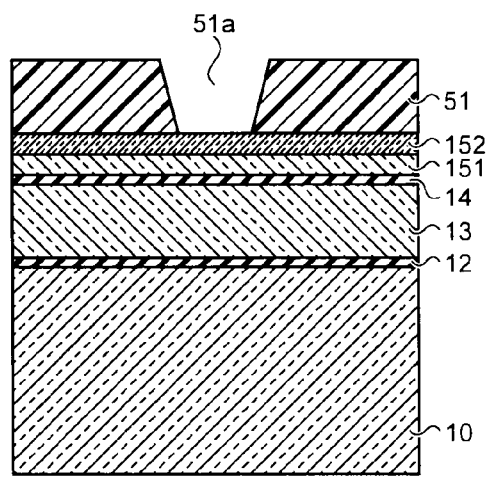
Figure 26A:
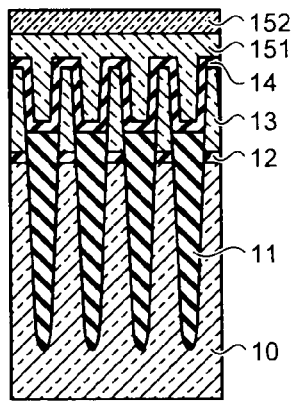
Figure 26B:
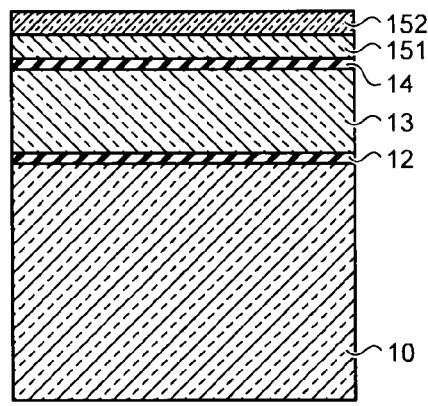
Figure 26C:
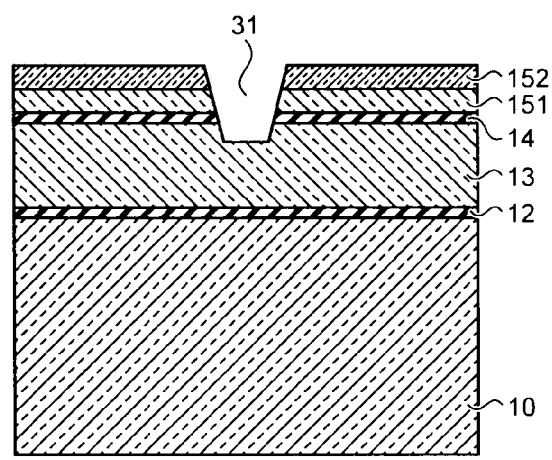

Then, the photoresist 51 is coated on the silicide phase-change suppressing layer 152, and a pattern having a passage 51a in a part of the area of the gate electrode of the peripheral circuit is formed through a photolithographic technique (FIGS. 25A to 25C). Then, etching is performed from the silicide phase-change suppressing layer 152 to the floating gate electrode 13 up to a predetermined depth by using this photoresist 51 as a mask to form the passage 31 (FIGS. 26A to 26C).

Figure 27A:
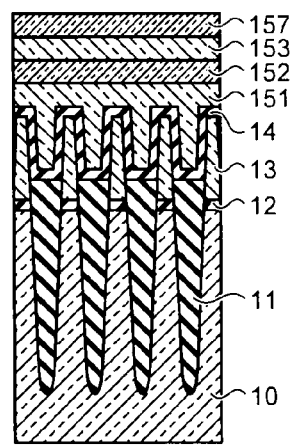
Figure 27B:
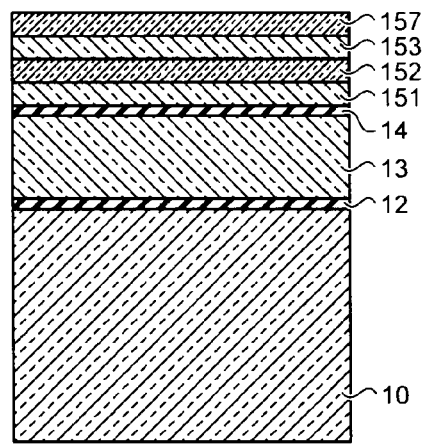
Figure 27C:
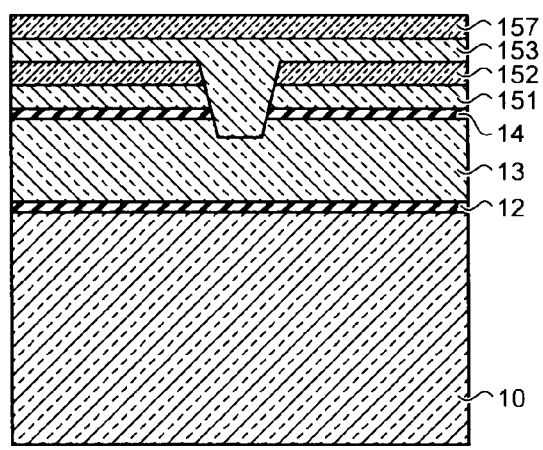

After removing the photoresist 51, the semiconductor film 153 and the silicide phase-change suppressing layer 157 are sequentially formed over the entire surface of the silicide phase-change suppressing layer 152 through a film deposition technique such as a CVD. In this case, in the peripheral circuit, the semiconductor film 153 is formed to embed the passage 31 (FIGS. 27A to 27C). As the semiconductor film 153, for example, a P-doped polycrystalline silicon film having a thickness of 40 to 60 nm may be used. In addition, as the silicide phase-change suppressing layer 157, for example, a polycrystalline silicon film in which silicide phase-change suppressing impurities such as C, F, or N are doped and which has a thickness of 20 nm may be used. The silicide phase-change suppressing layer 157 is formed by introducing the silicide phase-change suppressing impurities when the polycrystalline silicon film is formed. In this case, the silicide phase-change suppressing impurities are introduced to have a concentration of $1 \times 10^{21}$ [atom/cm$^3$] or lower.

Figure 28A:
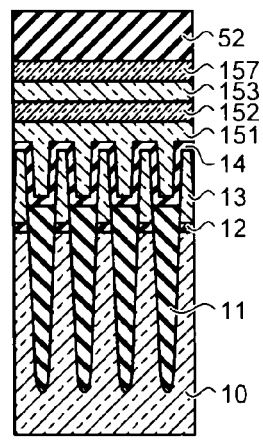
Figure 28B:
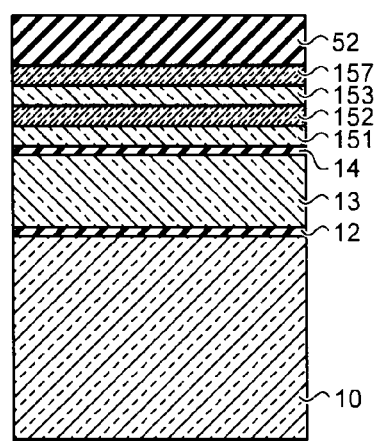
Figure 28C:
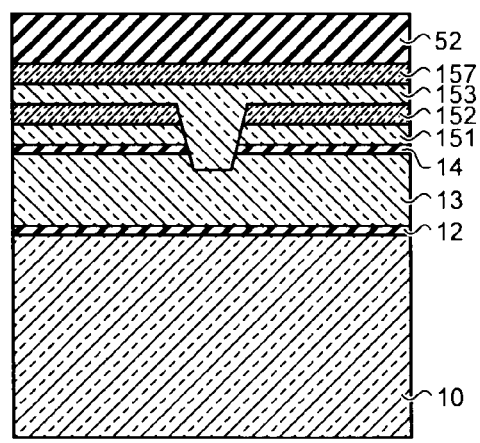

Then, after the mask film 52 is formed over the silicide phase-change suppressing layer 152, heat treatment is carried out to grow crystal grains contained in the semiconductor film 151, the silicide phase-change suppressing layer 152, the semiconductor film 153, and the silicide phase-change suppressing layer 157 (FIGS. 28A to 28C). For example, the heat treatment is carried out at a temperature of 600° C. or higher. As a result, for example, the silicon crystal grains of the semiconductor films 151 and 153 have a diameter of approximately 300 nm, and the silicon crystal grains of the silicide phase-change suppressing layers 152 and 157 have a diameter equal to or smaller than 200 nm. The diameter of silicon crystal grains of the silicide phase-change suppressing layers 152 and 157 is reduced as the concentration of the silicide phase-change suppressing impurities increases. In addition, the mask film 52 is made of a material capable of providing an etching selection ratio between silicide phase-change suppressing layer 157 and the gate insulation film 12. For example, a silicon nitride film and the like having a thickness capable of etching from the silicide phase-change suppressing layer 157 to the gate insulation film 12 in the subsequent process may be used.

Figure 29A:
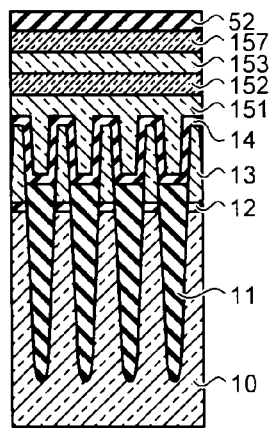
Figure 29B:
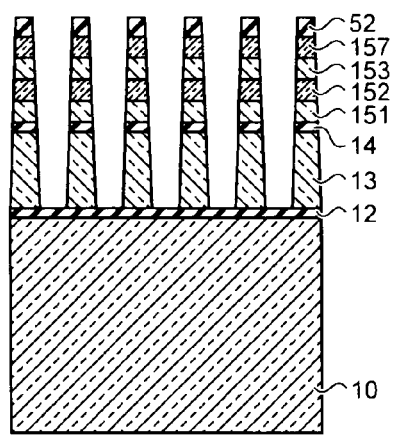
Figure 29C:
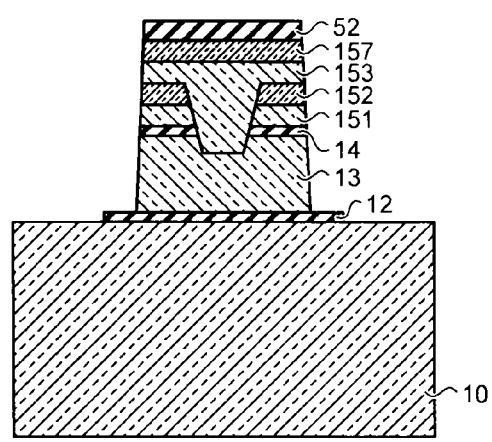

Then, a photoresist is coated on the mask film 52. A line-and-space shaped pattern extending in the word line direction is formed in the memory cell unit through a photolithographic technique, and a predetermined gate electrode shaped pattern is formed in the peripheral circuit. Then, the pattern of the photoresist is transferred to the mask film 52, and the etching is performed from the silicide phase-change suppressing layer 157 to the floating gate electrode 13 using the patterned mask film 52 through an etching technique such as an RIE (FIGS. 29A to 29C). As a result, in the memory cell, a stack gate structure including the gate insulation film 12, the floating gate electrode 13, the interelectrode insulation film 14, the semiconductor film 151, the silicide phase-change suppressing layer 152, the semiconductor film 153, and the silicide phase-change suppressing layer 157 is formed over the channel region between the device isolation/insulation films 11. In addition, in the peripheral circuit, a gate structure including the gate insulation film 12, the floating gate electrode 13, the interelectrode insulation film 14, the semiconductor film 151, the silicide phase-change suppressing layer 152, the semiconductor film 153, and the silicide phase-change suppressing layer 157 is formed over the channel region while the floating gate electrode 13 and the semiconductor film 153 are connected to each other by the passage 31 provided in the interelectrode insulation film 14, the semiconductor film 151, and the silicide phase-change suppressing layer 152. Then, the gate insulation film 12 of the peripheral circuit is etched in a predetermined shape using a photoresist (not shown).

Figure 30A:
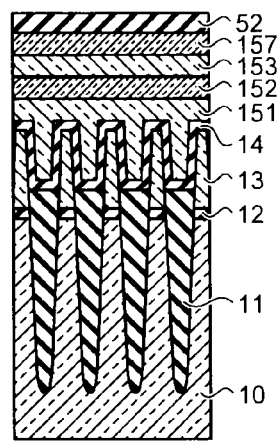
Figure 30B:
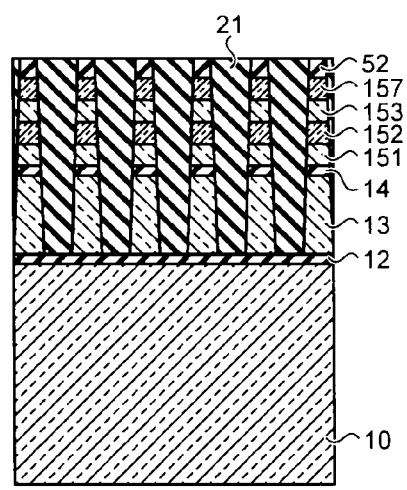
Figure 30C:
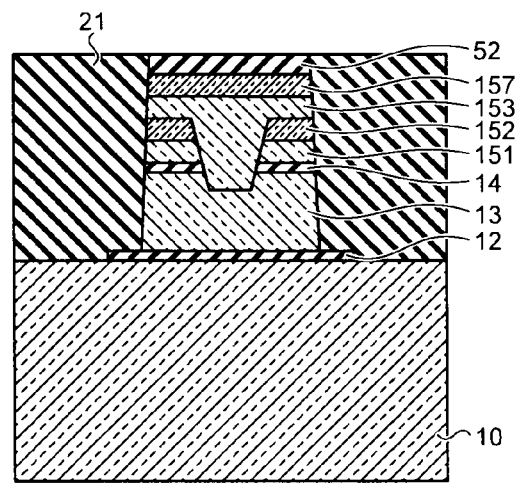
Figure 31A:
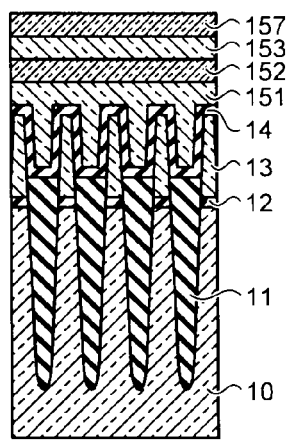
Figure 31B:
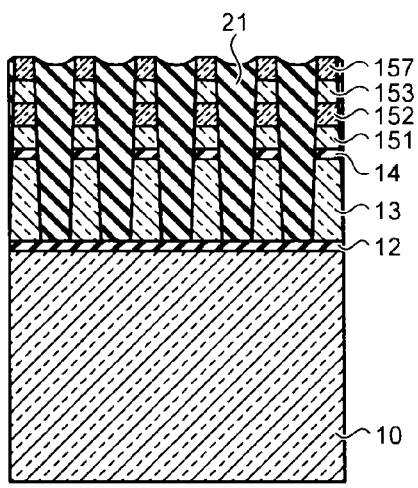
Figure 31C:
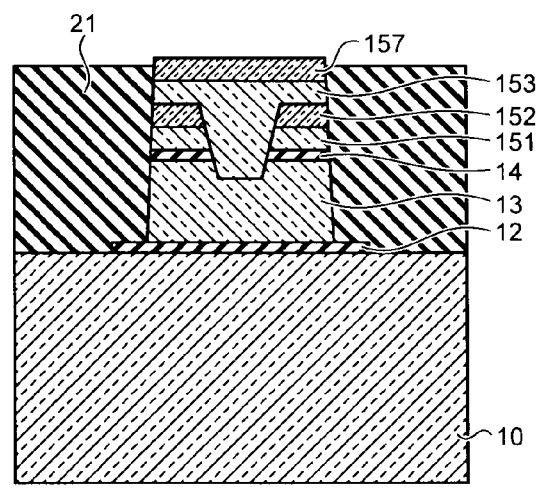

Then, the interlayer insulation film 21 is formed to embed the etched area and be higher than the top surface of the mask film 52, and then, the interlayer insulation film 21 formed to be higher than the top surface of the mask film 52 is removed through a CMP technique by using the mask film 52 as a stopper (FIGS. 30A to 30C). As the interlayer insulation film 21, for example, a silicon oxide film may be used. Then, the mask film 52 is removed through an RIE technique, a wet process, or the like (FIGS. 31A to 31C). As a result, in the memory cell and the peripheral circuit, the top surface of the silicide phase-change suppressing layer 157 is exposed.

Figure 32A:
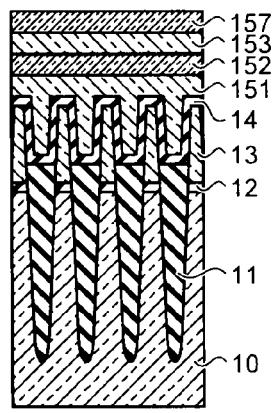
Figure 32B:
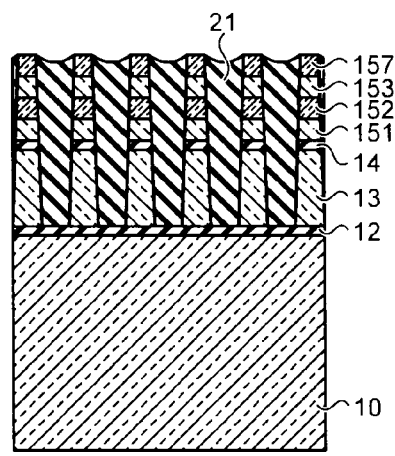
Figure 32C:
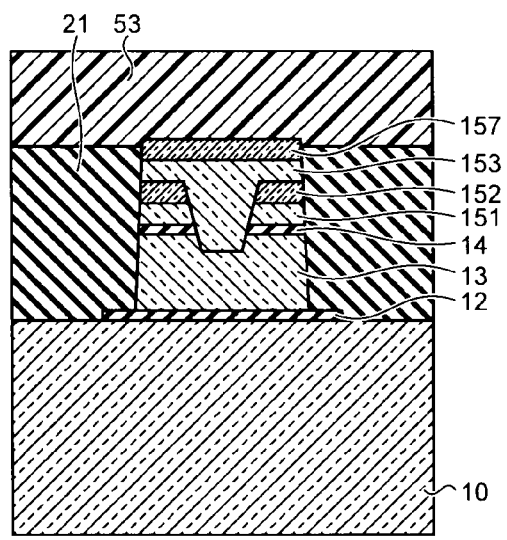
Figure 33A:
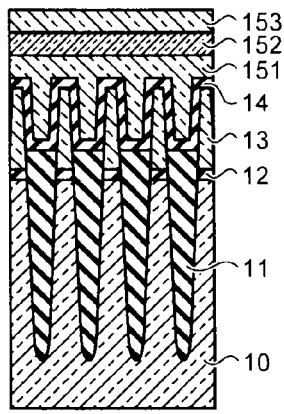
Figure 33B:
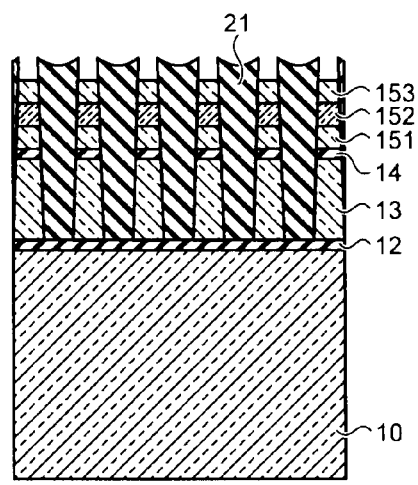
Figure 33C:
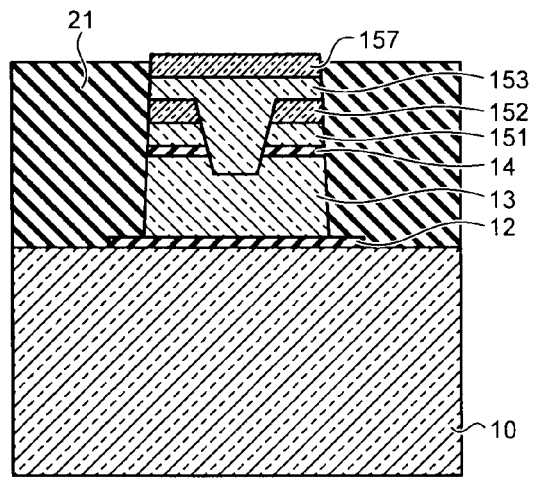

Then, the photoresist 53 is coated on the entire surface of the semiconductor substrate 10, and patterning is carried out such that only the peripheral circuit is coated by the photoresist 53 through a photolithographic technique (FIGS. 32A to 32C). Then, the etch-back is carried out through an RIE technique or a chemical dry etching (CDE) technique, and the silicide phase-change suppressing layer 157 positioned in the outermost layer of the control gate electrode 15 in the memory cell is removed (FIGS. 33A to 33C). As a result, the uppermost layer of the control gate electrode 15 in the memory cell corresponds to the semiconductor film 153, and the uppermost layer of the gate electrode in the peripheral circuit corresponds to the silicide phase-change suppressing layer 157.

Figure 34A:
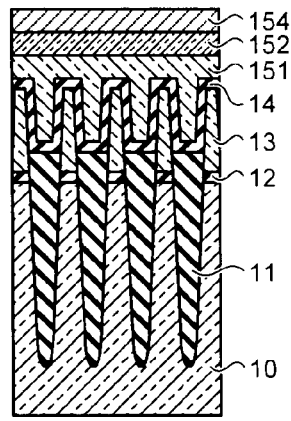
Figure 34B:
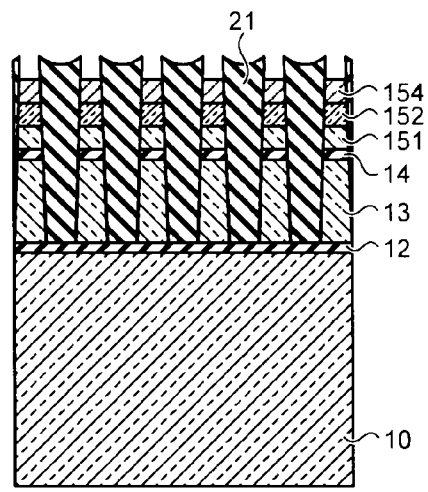
Figure 34C:
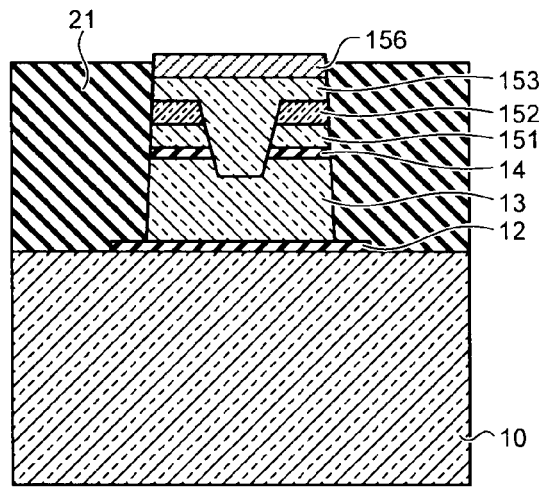

After removing the photoresist 53, a metal film capable of being silicided by reacting with silicon is formed over the entire surface of the semiconductor substrate 10 through a film deposition technique such as sputtering, and heat treatment is carried out to silicide the semiconductor film 153 so that a silicide film 154 is formed. In the peripheral circuit, the silicide film 156 is formed by siliciding the silicide phase-change suppressing layer 157 or additionally the semiconductor film 153 (FIGS. 34A to 34C). As the metal film, for example, Ni, Co, W, and the like may be used. During the heat treatment, silicidation is progressed from the top surface side of the semiconductor film 153. However, in the memory cell, silicidation is suppressed in the vicinity of the silicide phase-change suppressing layer 152 present near the middle of the control gate electrode 15. That is, the silicidation is not progressed up to the interelectrode insulation film 14, and stops in the vicinity of the position of the silicide phase-change suppressing layer 152. As a result, the thickness of the silicide film 154 can be controlled substantially uniformly within the area of the memory cell unit. In addition, in the peripheral circuit, a part of the semiconductor film 153 and the silicide phase-change suppressing layer 152 or the silicide phase-change suppressing layer 152 are silicided.

Then, an unreacted part of the metal film is removed, and impurity ions having a predetermined conductivity type are implanted onto the surface of the semiconductor substrate 10 in both sides along the bit line direction of the stack gate structure in the memory cell and the surface of the semiconductor substrate 10 along the longitudinal direction of the channel of the gate structure in the peripheral circuit and activated so that the nonvolatile semiconductor memory device having a structure shown in FIGS. 23A to 23C is obtained.

According to the third embodiment, since the silicide phase-change suppressing layer 152 is disposed in the intermediate layer of the control gate electrode 15 as in the first embodiment, it is possible to suppress silicidation of the polycrystalline silicon layer of the control gate electrode 15 and suppress voids from being generated under the control gate electrode 15 as the volume of the silicide film is changed in the thermal process subsequent to the silicide formation. Furthermore, it is possible to make the thickness of the silicide film in the area of the memory cell uniform. Similar to the second embodiment, since the silicide film 156 obtained by siliciding the silicide phase-change suppressing layer 157 is provided in the upper layer side of the gate electrode 16, a heat resistance of the silicide film 156 is improved, and agglomeration or contraction is rarely generated in the silicide film 156. As a result, it is possible to improve a resistance to agglomeration in the subsequent thermal process for the silicide film 156 of the peripheral circuit which has a silicide thickness smaller than that of the memory cell.

Fourth Embodiment

Figure 35A:
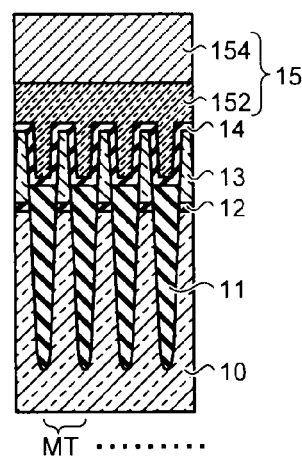
FIGS. 35A to 35C are cross-sectional views schematically illustrating an exemplary configuration of a nonvolatile semiconductor memory device according to a fourth embodiment.
Figure 35B:
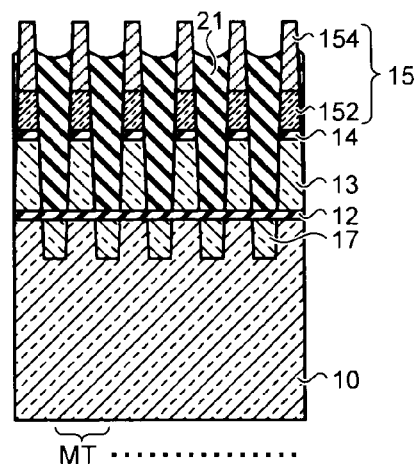
Figure 35C:
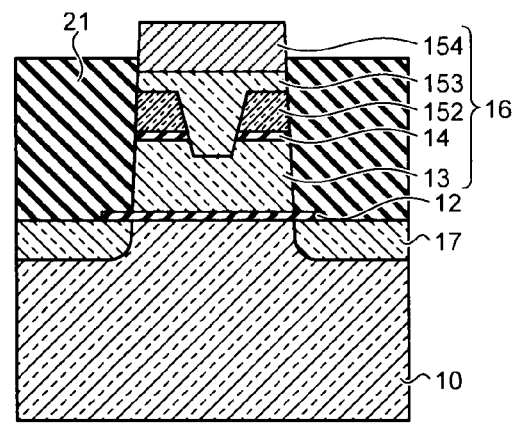

FIGS. 35A to 35C are cross-sectional views schematically illustrating an exemplary configuration of the nonvolatile semiconductor memory device according to the fourth embodiment. FIG. 35A is a cross-sectional view taken along the direction perpendicular to the word line extending direction of the memory cell, FIG. 35B is a cross-sectional view taken along the word line extending direction of the same memory cell, and FIG. 35C is a cross-sectional view illustrating the peripheral circuit transistor. According to the fourth embodiment, since the structures of the corresponding parts of the control gate electrode 15 of the memory cell and the control gate electrode 15 of the peripheral circuit are different from those of the first embodiment, description will be made for the parts different from those of the first embodiment.

The control gate electrode 15 of the memory cell has a structure obtained by sequentially stacking the silicide phase-change suppressing layer 152 and the silicide film 154 as shown in FIGS. 35A and 35B. For example, the silicide phase-change suppressing layer 152 includes a silicide film in which silicide phase-change suppressing impurities such as C, F, or N are doped and which has a thickness of 10 to 60 nm. The silicon grains of the silicide phase-change suppressing layer 152 preferably have an average grain diameter equal to or smaller than 200 nm. Similar to the first embodiment, the silicide phase-change suppressing impurities act to suppress a phase-change reaction of the silicide and migration of silicide metal.

In addition, the silicide film 154 is formed over the silicide phase-change suppressing layer 152, and includes a silicide film such as a nickel silicide film or a cobalt silicide film, for example, having a thickness of 40 to 60 nm. The silicide film 154 includes a layer having a high concentration of the silicide phase-change suppressing impurities in the silicide phase-change suppressing layer 152 side and a layer rarely containing the silicide phase-change suppressing impurity in the top surface side.

In addition, the gate electrode 16 of the peripheral circuit has a structure obtained by sequentially stacking the floating gate electrode 13, the interelectrode insulation film 14, the silicide phase-change suppressing layer 152, the semiconductor film 153, and the silicide film 154 on the gate insulation film 12 as shown in FIG. 13C.

In this manner, according to the fourth embodiment, since the silicide phase-change suppressing layer 152 is disposed immediately over the interelectrode insulation film 14, it is possible to suppress voids from being generated from the silicide in the subsequent thermal process even when the silicide film 154 reaches the vicinity of the interelectrode insulation film 14.

Figure 38A:
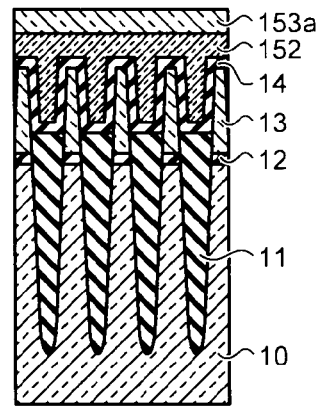
Figure 38B:
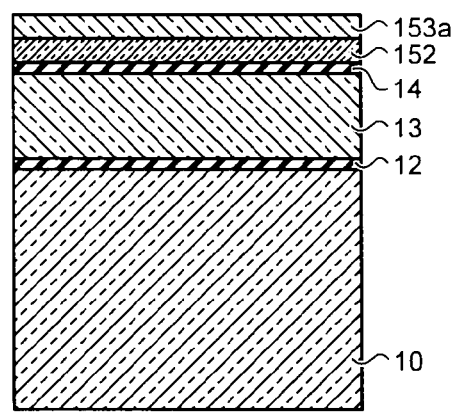
Figure 38C:
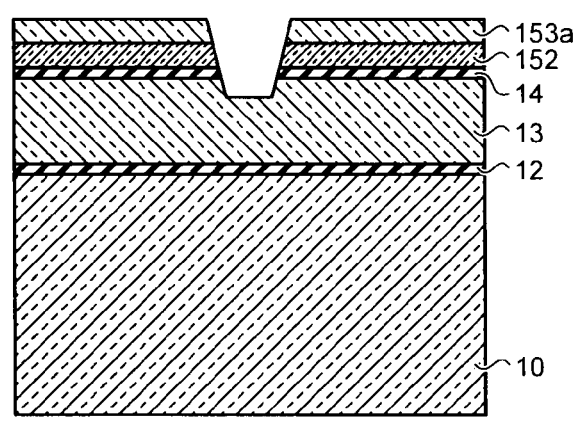
Figure 39A:
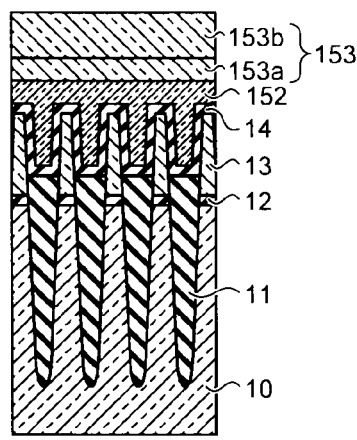
Figure 39B:
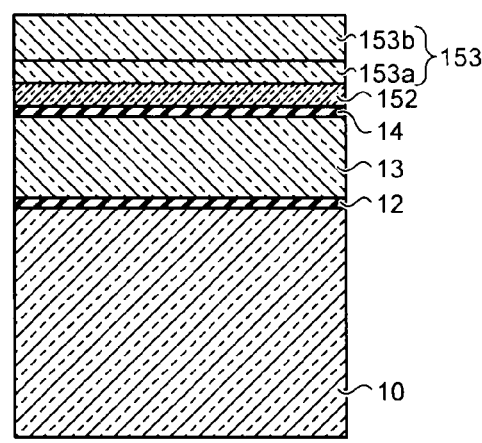
Figure 39C:
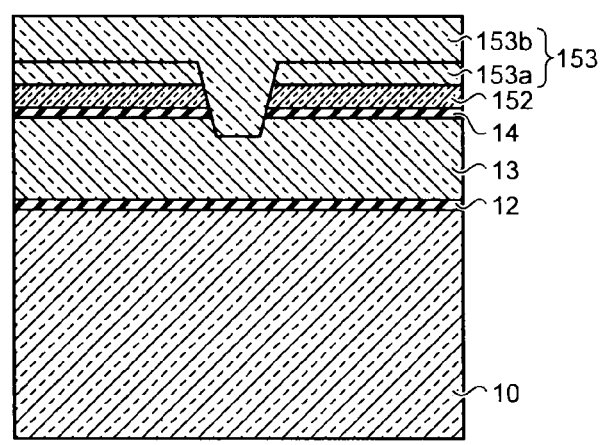

Next, a method of manufacturing the nonvolatile semiconductor memory device having such a structure will be described. FIGS. 39A to 39C are cross-sectional views schematically illustrating an exemplary sequence of a method of manufacturing the nonvolatile semiconductor memory device according to the fourth embodiment. In these drawings, FIGS. 36A, 37A, 38A, and 39A illustrate cross sections along the bit line direction of the memory cell, FIGS. 36B, 37B, 38B, and 39B illustrate cross sections along the word line direction of the memory cell, and FIGS. 36C, 37C, 38C, and 39C illustrate cross sections of the peripheral circuit.

Figure 36A:
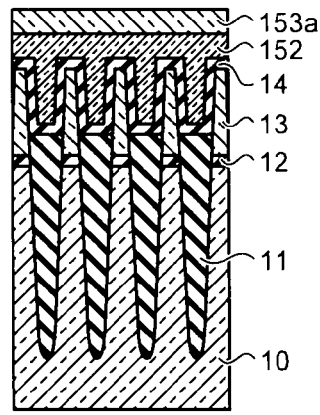
FIGS. 36A to 39C are cross-sectional views schematically illustrating an exemplary sequence of a method of manufacturing the nonvolatile semiconductor memory device according to the fourth embodiment.
Figure 36B:
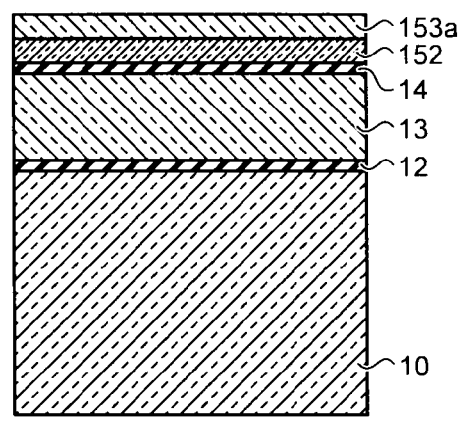
Figure 36C:
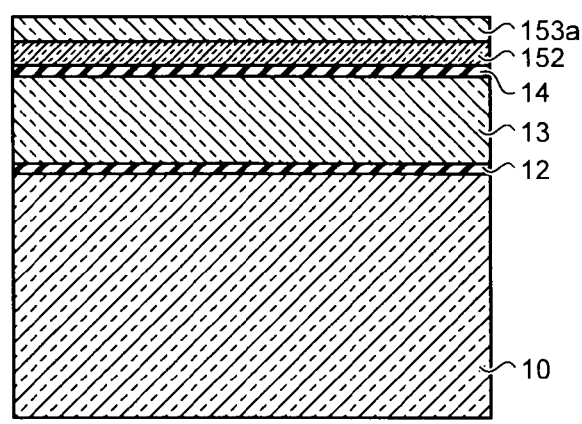

First, through a method known in the art, the gate insulation film 12, the floating gate electrode 13, and the mask film are stacked over the semiconductor substrate 10 such as a silicon substrate. Then, a line-and-space shaped pattern extending in the bit line direction is formed on the mask film of the memory cell. Then, the gate insulation film 12 and the floating gate electrode 13 of the memory cell are etched through an anisotropic etching technique such as a RIE by using the mask film as a mask, and the semiconductor substrate 10 is etched up to a predetermined depth Then, the device isolation/insulation film 11 such as a silicon oxide film is embedded in the etched area and etched back up to a predetermined depth. After removing the mask film, the interelectrode insulation film 14, the silicide phase-change suppressing layer 152, and the semiconductor film 153a are sequentially formed over the entire surface of the semiconductor substrate 10 through a film deposition technique such as a CVD (FIGS. 36A to 36C). Here, as the silicide phase-change suppressing layer 152, for example, a polycrystalline silicon film in which silicide phase-change suppressing impurities such as C, F, or N are doped and which has a thickness of 10 to 60 nm may be used. The silicide phase-change suppressing layer 152 is formed by introducing the silicide phase-change suppressing impurities such as C, F, or N when the polycrystalline silicon film is formed. In this case, the silicide phase-change suppressing impurities are introduced to have a concentration of $1\times10^{20}$ [atom/cm$^3$] or higher or $5\times10^{21}$ [atom/cm$^3$] or lower. In addition, as the semiconductor film 153a, for example, a P-doped polycrystalline silicon film may be used.

Figure 37A:
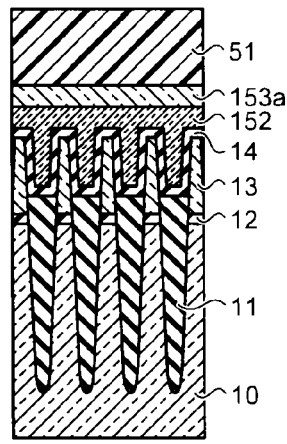
Figure 37B:
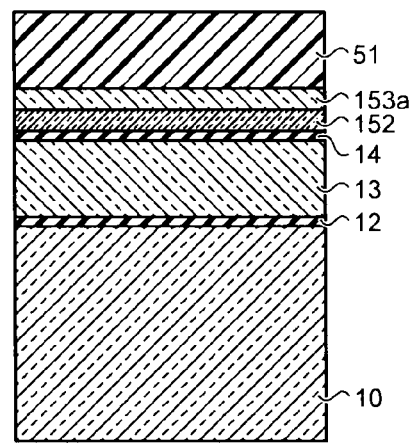
Figure 37C:
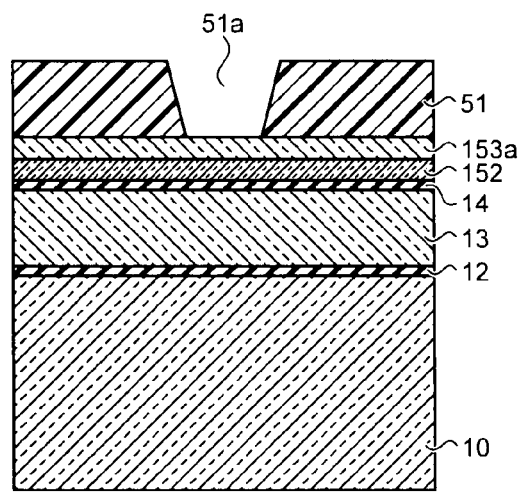

Then, the photoresist 51 is coated on the semiconductor film 153a, and a pattern having a passage 51a in a part of the area of the gate electrode of the peripheral circuit is formed through a photolithographic technique (FIGS. 37A to 37C). Then, etching is performed from the semiconductor film 153a to the floating gate electrode 13 up to a predetermined depth by using this photoresist 51 as a mask to form the passage 31 (FIGS. 38A to 38C).

After removing the photoresist 51, the semiconductor film 153b is formed over the entire surface of the semiconductor film 153a through a film deposition technique such as a CVD. In this case, in the peripheral circuit, the semiconductor film 153b is formed to fill up the passage 31 (FIGS. 39A to 39C). As the semiconductor film 153b, for example, a P-doped polycrystalline silicon film may be used. In addition, the semiconductor film 153 including the semiconductor films 153a and 153b may have a total thickness of 20 to 40 nm.

Then, processes the same as those corresponding to the remainder of FIGS. 7A to 7C of the first embodiment or processes the same as those corresponding to the remainder of FIGS. 18A to 18C of the second embodiment are carried performed so that the nonvolatile semiconductor memory device shown in FIGS. 35A to 35C can be obtained.

According to the fourth embodiment, the silicide phase-change suppressing layer 152 is disposed in advance only in the lowermost layer of the control gate electrode 15 (immediately over the interelectrode insulation film 14). Therefore, it is possible to suppress voids from being generated from the silicide film 154 in the subsequent thermal process even when the silicide film 154 reaches the vicinity of the interelectrode insulation film 14. In addition, since the silicide phase-change suppressing layer 152 is strongly resistant to acid, it is possible to suppress generation of a bird's beak in the interelectrode insulation film 14 and improve a coupling ratio. However, the concentration of the silicide phase-change suppressing impurities such as C, F, or N of the silicide phase-change suppressing layer 152 is set to be equal to or lower than $5\times10^{20}$ [atoms/cm$^3$]. As a result, it is possible to suppress reduction of an activation rate of the impurities disposed immediately over the interelectrode insulation film 14 or depletion thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a memory cell transistor obtained by sequentially stacking a gate insulation film, a floating gate electrode, an interelectrode insulation film, and a control gate electrode above a semiconductor substrate; and
   a peripheral circuit transistor, obtained by sequentially stacking the gate insulation film, the floating gate electrode, the interelectrode insulation film, and the control gate electrode above the semiconductor substrate, the peripheral circuit transistor being disposed in a position other than a position where the memory cell transistor is formed, wherein
   in the memory transistor, the control gate electrode has a structure in which a first semiconductor film, a silicide phase-change suppressing layer, and a silicide film are sequentially stacked above the interelectrode insulation film,
   in the peripheral circuit transistor, the control gate electrode of the peripheral circuit transistor has a structure in which the first semiconductor film, the silicide phase-change suppressing layer, a second semiconductor film, and
   in the peripheral circuit transistor, the second semiconductor film of the peripheral circuit transistor is connected to the floating gate electrode through an opening formed in the silicide phase-change suppressing layer, the first semiconductor film, and the interelectrode insulation film, and
   the silicide phase-change suppressing layer includes a polycrystalline silicon film in which at least one of C, F, and N is doped in a concentration range of $1\times10^{20}$ to $5\times10^{21}$ [atom/cm$^3$].

2. The nonvolatile semiconductor memory device according to claim 1, wherein the first semiconductor film includes silicon grains having an average grain diameter equal to or larger than 250 nm, and
   the silicide phase-change suppressing layer is made of silicon grains having an average grain diameter equal to or smaller than 200 nm.

3. The nonvolatile semiconductor memory device according to claim 1, wherein the first semiconductor film includes a polycrystalline silicon film in which at least one of P, As, and B is doped.

4. The nonvolatile semiconductor memory device according to claim 1, wherein the floating gate electrode includes a polycrystalline silicon film in which any one of P, As, and B is doped or a silicon nitride film.

5. The nonvolatile semiconductor memory device according to claim 1, wherein a plurality of memory cell columns, each column including a plurality of the memory cell transistors connected in series along a first direction, are arranged on the semiconductor substrate at a predetermined interval in a second direction intersecting the first direction,
the nonvolatile semiconductor memory device further comprises an interlayer insulation film that isolates the floating gate electrode, the interelectrode insulation film, and the control gate electrode of one of the memory cell transistors, respectively from the floating gate electrode, the interelectrode insulation film, and the control gate electrode of another one of the memory cell transistors, the one memory cell transistor and the another memory cell transistor being adjacent to each other in the first direction, and
a top surface of the interlayer insulation film is higher than a top surface of the control gate electrode of the memory cell transistor.

6. The nonvolatile semiconductor memory device according to claim 1,
wherein the first and second semiconductor films include silicon grains having an average grain diameter equal to or larger than 250 nm, and
the silicide phase-change suppressing layer includes silicon grains having an average grain diameter equal to or smaller than 200 nm.

7. The nonvolatile semiconductor memory device according to claim 1,
wherein the second semiconductor film formed in the opening includes a polycrystalline silicon film in which at least one of P, As, and B is doped.

8. A nonvolatile semiconductor memory device comprising:
a memory cell transistor obtained by sequentially stacking a gate insulation film, a floating gate electrode, an interelectrode insulation film, and a control gate electrode above a semiconductor substrate; and
a peripheral circuit transistor, obtained by sequentially stacking the gate insulation film, the floating gate electrode, the interelectrode insulation film, and the control gate electrode over the semiconductor substrate, which is included in a position other than a position where the memory cell transistor is formed, wherein
in the memory transistor, the control gate electrode has a structure in which a silicide phase-change suppressing layer and a silicide film are sequentially stacked above the interelectrode insulation film,
in the peripheral circuit transistor, the control gate electrode has a structure in which the silicide phase-change suppressing layer, a semiconductor film, and the silicide film are sequentially stacked above the interelectrode insulation film, and
in the peripheral circuit transistor, the semiconductor film is connected to the floating gate electrode through an opening formed in the silicide phase-change suppressing layer and the interelectrode insulation film, and
the silicide phase-change suppressing layer includes a polycrystalline silicon film in which at least one of C, F, and N is doped in a concentration range of $1 \times 10^{20}$ to $5 \times 10^{21}$ [atom/cm$^3$].

9. The nonvolatile semiconductor memory device according to claim 8,
wherein the silicide phase-change suppressing layer includes silicon grains having an average grain diameter equal to or smaller than 200 nm.

10. The nonvolatile semiconductor memory device according to claim 8,
wherein at least one of C, F, and N doped in the silicide phase-change suppressing layer is contained in the silicide phase-change suppressing layer side of the silicide film, and at least one of C, F, and N doped in the silicide phase-change suppressing layer is rarely doped in a top surface side.

11. The nonvolatile semiconductor memory device according to claim 8,
wherein the floating gate electrode includes a polycrystalline silicon film in which at least one of P, As, and B is doped or a silicon nitride film.

12. The nonvolatile semiconductor memory device according to claim 8,
wherein the semiconductor film includes silicon grains having an average grain diameter equal to or larger than 250 nm, and
the silicide phase-change suppressing layer includes silicon grains having an average grain diameter equal to or smaller than 200 nm.

* * * * *